US012677524B2

(12) United States Patent
Adachi et al.

(10) Patent No.: US 12,677,524 B2
(45) Date of Patent: ***Jul. 7, 2026

(54) ORGANIC MODULATION ELEMENT AND MODULATION DEVICE

(71) Applicants: KYUSHU UNIVERSITY, NATIONAL UNIVERSITY CORPORATION, Fukuoka (JP); HAMAMATSU PHOTONICS K.K., Hamamatsu (JP)

(72) Inventors: Chihaya Adachi, Fukuoka (JP); Hajime Nakanotani, Fukuoka (JP); Takahiko Yamanaka, Hamamatsu (JP); Shigeo Hara, Hamamatsu (JP)

(73) Assignees: HAMAMATSU PHOTONICS K.K., Hamamatsu (JP); KYUSHU UNIVERSITY, NATIONAL UNIVERSITY CORPORATION, Fukuoka (JP)

( * ) Notice: Subject to any disclaimer, the term of this patent is extended or adjusted under 35 U.S.C. 154(b) by 1085 days.

This patent is subject to a terminal disclaimer.

(21) Appl. No.: 17/578,629

(22) Filed: Jan. 19, 2022

(65) Prior Publication Data

US 2022/0238832 A1 Jul. 28, 2022

(30) Foreign Application Priority Data

Jan. 22, 2021 (JP) ................................. 2021-008681
May 11, 2021 (JP) ................................. 2021-080517

(51) Int. Cl.
*H10K 50/11* (2023.01)
*H10K 50/805* (2023.01)
(Continued)

(52) U.S. Cl.
CPC ........... *H10K 50/11* (2023.02); *H10K 50/805* (2023.02); *H10K 2101/10* (2023.02); *H10K 2102/3023* (2023.02)

(58) Field of Classification Search
CPC ............... H10K 50/11; H10K 2101/10; H10K 2102/3023
See application file for complete search history.

(56) References Cited

U.S. PATENT DOCUMENTS

2013/0264518 A1 10/2013 Yersin
2013/0277656 A1 10/2013 Seo
(Continued)

FOREIGN PATENT DOCUMENTS

JP H9-294229 A 11/1997
JP 2007-123707 A 5/2007
(Continued)

OTHER PUBLICATIONS

Yamanaka (Year: 2019).*
(Continued)

*Primary Examiner* — Sadie White
(74) *Attorney, Agent, or Firm* — Faegre Drinker Biddle & Reath LLP

(57) ABSTRACT

Provided is an organic modulation element including an organic modulation layer containing a plurality of organic semiconductor molecules, a first electrode, and a second electrode. Each of the plurality of organic semiconductor molecules is a molecule in which an excited state enabling reverse intersystem crossing from a lowest excited triplet state to a lowest excited singlet state is formed due to irradiation with the input light. In each of the plurality of organic semiconductor molecules, an intersystem crossing rate constant from the lowest excited singlet state to the lowest excited triplet state is greater than a reverse intersys- (Continued)

tem crossing rate constant from the lowest excited triplet state to the lowest excited singlet state, and the reverse intersystem crossing rate constant from the lowest excited triplet state to the lowest excited singlet state is greater than a non-radiative deactivation rate constant from the lowest excited triplet state to a ground state.

13 Claims, 13 Drawing Sheets

(51) Int. Cl.
        H10K 101/10        (2023.01)
        H10K 102/00        (2023.01)

(56)                    References Cited

U.S. PATENT DOCUMENTS

| | | | | |
|---|---|---|---|---|
| 2018/0149595 | A1* | 5/2018 | Adachi | H10K 85/10 |
| 2018/0190924 | A1* | 7/2018 | Tsang | H10K 85/30 |
| 2019/0131531 | A1 | 5/2019 | Luschtinetz | |
| 2020/0317704 | A1 | 10/2020 | Galan | |
| 2020/0371269 | A1 | 11/2020 | Margaritova et al. | |
| 2024/0057354 | A1* | 2/2024 | Adachi | H10K 30/353 |

FOREIGN PATENT DOCUMENTS

| | | | |
|---|---|---|---|
| JP | 2013-533626 | A | 2/2015 |
| JP | 2017206666 | A | 11/2017 |
| JP | 2018124471 | A | 8/2018 |
| JP | 2019-535136 | A | 12/2019 |
| JP | 2020098789 | A | 6/2020 |
| JP | 6735215 | B2 | 8/2020 |
| WO | 2012/001002 | A2 | 1/2012 |
| WO | WO-2013/054818 | A1 | 4/2013 |
| WO | WO-2014/156771 | A1 | 10/2014 |
| WO | WO-2018/055379 | A1 | 3/2018 |
| WO | WO-2018/207776 | A1 | 11/2018 |
| WO | 2020229909 | A1 | 11/2020 |

OTHER PUBLICATIONS

Wang (Year: 2015).*
Yamanaka (Year: 2017).*
Yamanaka Supplemental (Year: 2019).*
International Preliminary Report on Patentability issued Aug. 3, 2023 in PCT/JP2022/001425.
Xu Wang et al., "High performance organic ultraviolet photodetector with efficient electroluminescence realized by a thermally activated delayed fluorescence emitter", Applied Physics Letters, URL: DOI:10.1063/1.4927652, 2015, vol. 107, ppp.043303-1-043303-5.
Mengge Wu et al., "High-performance organic light-emitting photodetector fabricated by separating photodetective center from emissive layer without luminance trade-off", Optics Letters, URL: DOI:10. 1364/OL.43.004502, 2018, vol. 43, No. 18, ppp.4502-4505.
Office Action dated Sep. 16, 2025 for U.S. Appl. No. 18/269,627.

* cited by examiner

ORGANIC MODULATION ELEMENT AND MODULATION DEVICE

TECHNICAL FIELD

The present disclosure relates to an organic modulation element and a modulation device.

BACKGROUND

A solar cell including a wavelength conversion film and a photoelectric conversion element is described in International Publication WO 2013/054818. An organic fluorescent substance that converts light in a short wavelength region into light in a long wavelength region is used for the wavelength conversion film described in International Publication WO 2013/054818.

SUMMARY

The wavelength conversion film described in International Publication WO 2013/054818 only has a certain function of converting light in a short wavelength region into light in a long wavelength region, and it is difficult to modulate input light in correspondence with a purpose.

An object of the present disclosure is to provide an organic modulation element capable of modulating input light in correspondence with a purpose and a modulation device including the organic modulation element.

According to an aspect of the present disclosure, there is provided an organic modulation element including: an organic modulation layer containing a plurality of organic semiconductor molecules; a first electrode having a light-transmitting property with respect to input light to the organic modulation layer, and disposed on one side of the organic modulation layer; and a second electrode disposed on the other side of the organic modulation layer. Each of the plurality of organic semiconductor molecules is a molecule in which an excited state enabling reverse intersystem crossing from a lowest excited triplet state to a lowest excited singlet state in each of the plurality of organic semiconductor molecules is formed due to irradiation with the input light. In each of the plurality of organic semiconductor molecules, an intersystem crossing rate constant from the lowest excited singlet state to the lowest excited triplet state is greater than a reverse intersystem crossing rate constant from the lowest excited triplet state to the lowest excited singlet state. In each of the plurality of organic semiconductor molecules, the reverse intersystem crossing rate constant from the lowest excited triplet state to the lowest excited singlet state is greater than a non-radiative deactivation rate constant from the lowest excited triplet state to a ground state.

DETAILED DESCRIPTION

Figure 1:
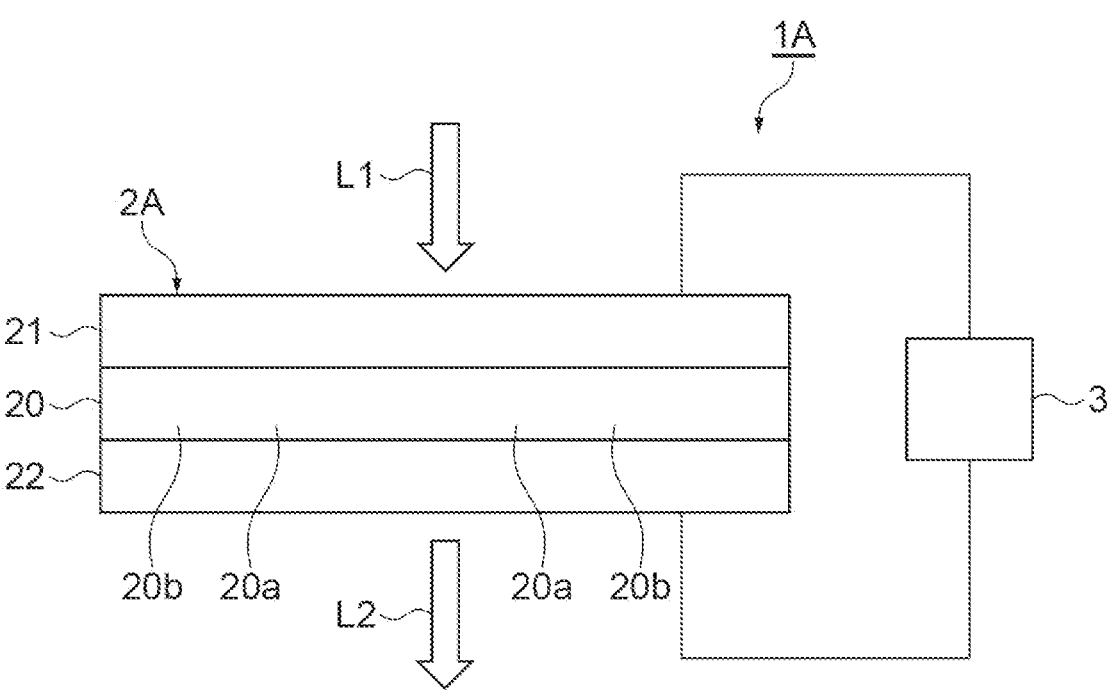
FIG. 1 is a configuration diagram of a modulation device according to a first embodiment.

Hereinafter, embodiments of the present disclosure will be described in detail with reference to the accompanying drawings. Note that, in the respective drawings, the same reference numeral will be given to the same or equivalent portion, and redundant description will be omitted.

First Embodiment

As illustrated in FIG. 1, a modulation device 1A according to a first embodiment includes an organic modulation element 2A. The organic modulation element 2A according to the first embodiment includes an organic modulation layer 20, a first electrode 21, and a second electrode 22. The first electrode 21 is disposed on one side (one side in a thickness direction of the organic modulation layer 20) of the organic modulation layer 20. The second electrode 22 is disposed on the other side (side opposite to the one side in the thickness direction of the organic modulation layer 20) of the organic modulation layer 20. As an example, the second electrode 22, the organic modulation layer 20, and the first electrode 21 are stacked on a support substrate having a light-transmitting property (not illustrated) in this order.

The first electrode 21 has a light-transmitting property with respect to input light L1 to the organic modulation layer 20. The second electrode 22 has a light-transmitting property with respect to output light L2 from the organic modulation layer 20. As a material of an electrode that functions as a positive electrode between the first electrode 21 and the second electrode 22, for example, indium tin oxide, indium oxide, tin oxide, zinc oxide, and the like can be used. As a material of an electrode that functions as a negative electrode between the first electrode 21 and the second electrode 22, for example, aluminum, vanadium, gold, silver, platinum, iron, cobalt, carbon, nickel, tungsten, palladium, magnesium, calcium, tin, lead, titanium, yttrium, lithium, ruthenium, manganese, alloys containing these metals, and the like can be used. As an example, in the case of an oxide type, the thickness of each of the first electrode 21 and the second electrode 22 is, for example, approximately 100 nm because transparency is high and resistance is high. In the case of a metal type, the thickness is approximately 10 nm because resistance is low and transparency is low.

Note that, a buffer layer (not illustrated) configured to adjust a work function of an electrode and/or a charge injection barrier may be formed on at least one surface between a surface of the first electrode 21 on the organic modulation layer 20 side and a surface of the second electrode 22 on the organic modulation layer 20 side. It is necessary for the buffer layer on the first electrode 21 side to have a light-transmitting property with respect to the input light L1. It is necessary for the buffer layer on the second electrode 22 side to have a light-transmitting property with respect to the output light L2. As a material of a buffer layer on an electrode side that functions as a positive electrode between the first electrode 21 and the second electrode 22, for example, metal oxides such as molybdenum oxide, tungsten oxide, nickel oxide, and vanadium oxide, a conductive polymer represented by PEDOT:PSS, and the like can be used. As a material of a buffer layer on an electrode side that functions as a negative electrode between the first electrode 21 and the second electrode 22, for example, metals such as magnesium, silver, calcium, titanium, zinc, cesium, and lithium, alloys containing these metals, metal oxides such as titanium oxide and zinc oxide, alkali metal compounds such as lithium fluoride, sodium fluoride, potassium fluoride, and cesium fluoride, alkali-earth metal compounds such as magnesium fluoride and calcium fluoride, and the like can be used. Since the buffer layers are necessary to have a light-transmitting property with respect to the input light L1 or the output light L2, for example, the thickness of the buffer layers is preferably 50 nm or less.

In addition, a hole transport layer or an electron block layer may be disposed between an electrode that functions as a positive electrode between the first electrode 21 and the second electrode 22, and the organic modulation layer 20. An electron transport layer or a hole block layer may be disposed between an electrode that functions as a negative electrode between the first electrode 21 and the second electrode 22, and the organic modulation layer 20. A layer on the first electrode 21 side among the layers is necessary to have a light-transmitting property with respect to the input light L1. A layer on the second electrode 22 side among the layers is necessary to have a light-transmitting property with respect to the output light L2. As a material of the hole transport layer or the electron block layer, for example, metal oxides, porphyrin derivatives, phthalocyanine derivatives, oxazole derivatives, oxadiazole derivatives, triazole derivatives, imidazole derivatives, pyrazoline derivatives, pyrazolone derivatives, phenylenediamine derivatives, hydrazone derivatives, stilbene derivatives, polyarylalkane derivatives, triarylamine derivatives, carbazole derivatives, indolocarbazole derivatives, isoindole derivatives, acene-based derivatives, fluorene derivatives, fluorenone derivatives, polyvinylcarbazoles, polymer materials with aromatic amine introduced into a main chain or a side chain, oligomers, polysilanes, conductive polymers, and the like can be used. As a material of the electron transport layer or the hole block layer, for example, nitrogen-containing aromatic heterocyclic derivatives, dibenzofuran derivatives, dibenzothiophene derivatives, silole derivatives, aromatic hydrocarbon ring derivatives, and the like can be used.

The organic modulation layer 20 contains a plurality of organic semiconductor molecules 20a and a plurality of host molecules 20b. The plurality of organic semiconductor molecules 20a are constituted by the same kind of organic semiconductor molecules, and the plurality of host molecules 20b are constituted by the same kind of host molecules. That is, the organic modulation layer 20 contains one kind of organic semiconductor molecules 20a and one kind of host molecules 20b. In the organic modulation layer 20, charge separation occurs due to irradiation with the input light L1 (details thereof will be described later). As an example, the organic modulation layer 20 is formed on the second electrode 22 formed on the support substrate by vacuum evaporation of TPA-DCPP (the plurality of organic semiconductor molecules 20a) and CBP (the plurality of host molecules 20b) from evaporation sources different from each other. For example, the thickness of the organic modulation layer 20 is approximately 100 nm. For example, a mass ratio between the CBP and TPA-DCPP in the organic modulation layer 20 is 50:50.

The modulation device 1A further includes a controller 3. The controller 3 is electrically connected to the organic modulation element 2A. The controller 3 applies a voltage between the first electrode 21 and the second electrode 22 so that an electric field in a direction of causing charge separation occurs in the organic modulation layer 20, and modulates the voltage. As an example, in a case where the first electrode 21 is caused to function as a positive electrode and the second electrode 22 is caused to function as a negative electrode, the controller 3 may apply a voltage between the first electrode 21 and the second electrode 22 so that a potential of the first electrode 21 becomes negative with a potential of the second electrode 22 set as a reference, or may apply a voltage between the first electrode 21 and the second electrode 22 so that the potential of the second electrode 22 becomes positive with the potential of the first electrode 21 set as a reference. In addition, in a case where the first electrode 21 is caused to function as a negative electrode and the second electrode 22 is caused to function as a positive electrode, the controller 3 may apply a voltage between the first electrode 21 and the second electrode 22 so that the potential of the first electrode 21 becomes positive with the potential of the second electrode 22 set as a reference, or may apply a voltage between the first electrode 21 and the second electrode 22 so that the potential of the second electrode 22 becomes negative with the potential of the first electrode 21 set as a reference. For example, the controller 3 is constituted by a voltage application circuit, a current read-out circuit, or the like.

Figure 2:
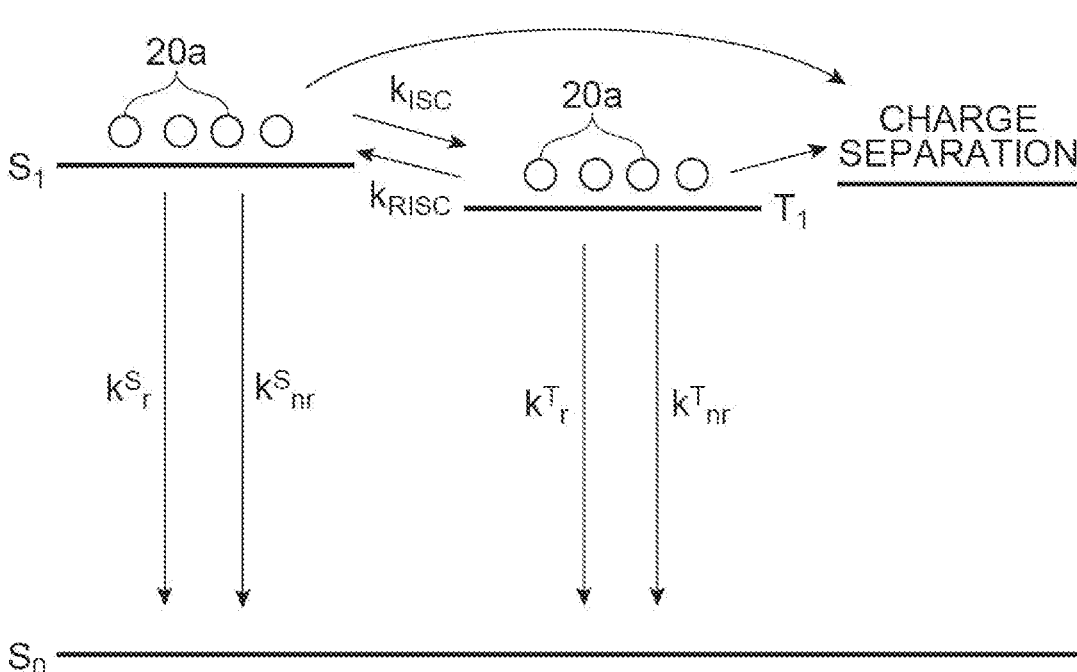
FIG. 2 is an energy diagram of an organic modulation layer illustrated in FIG. 1.

FIG. 2 is an energy diagram of the organic modulation layer 20 illustrated in FIG. 1. More specifically, FIG. 2 is an energy diagram of the organic modulation layer 20 in which an excited state is formed due to irradiation with the input light L1. In FIG. 2, $S_0$ represents a ground state, $S_1$ represents a lowest excited singlet state, $T_1$ represents a lowest excited triplet state. $k^s_r$ represents a fluorescence rate constant from the lowest excited singlet state $S_1$ to the ground state $S_0$, $k^s_{nr}$ represents a non-radiative deactivation rate constant from the lowest excited singlet state $S_1$ to the ground state $S_0$. $k^T_r$ represents a phosphorescence rate constant from the lowest excited triplet state $T_1$ to the ground state $S_0$, $k^T_{nr}$ represents a non-radiative deactivation rate constant from the lowest excited triplet state $T_1$ to the ground state $S_0$. $k_{ISC}$ represents an intersystem crossing rate constant from the lowest excited singlet state $S_1$ to the lowest excited triplet state $T_1$, and $k_{RISC}$ represents a reverse intersystem crossing rate constant from the lowest excited triplet state $T_1$ to the lowest excited singlet state $S_1$.

As illustrated in FIG. 2, each of the plurality of organic semiconductor molecules 20a is a molecule in which an excited state enabling reverse intersystem crossing from the lowest excited triplet state $T_1$ to the lowest excited singlet state $S_1$ in each of the plurality of organic semiconductor molecules $20a$ is formed due to irradiation with the input light L1. In this case, intersystem crossing from the lowest excited singlet state $S_1$ to the lowest excited triplet state $T_1$ is possible in each of the plurality of organic semiconductor molecules $20a$. Each of the plurality of organic semiconductor molecules $20a$ preferably includes a donor functional group, and an acceptor functional group.

Note that, the reverse intersystem crossing from "lowest excited triplet state $T_1$ to lowest excited singlet state $S_1$" includes not only "reverse intersystem crossing in which an excited molecule transitions from the lowest excited triplet state $T_1$ to the lowest excited singlet state $S_1$ without through another energy level", but also "reverse intersystem crossing in which an excited molecule transitions from the lowest excited triplet state $T_1$ to the lowest excited singlet state $S_1$ through another energy level (for example, a high-order energy level or the like)". Similarly, "intersystem crossing from the lowest excited singlet state $S_1$ to the lowest excited triplet state $T_1$" includes not only "intersystem crossing in which an excited molecule transitions from the lowest excited singlet state $S_1$ to the lowest excited triplet state $T_1$ without through another energy level", but also "intersystem crossing in which an excited molecule transitions from the lowest excited singlet state $S_1$ to the lowest excited triplet state $T_1$ through another energy level (for example, a high-order energy level or the like)".

In each of the plurality of organic semiconductor molecules $20a$, a difference between energy of the lowest excited singlet state $S_1$ and energy of the lowest excited triplet state $T_1$ at an absolute temperature of 77 K is less than 0.3 eV. Note that, although not illustrated in FIG. 2, energy of a lowest excited triplet state at an absolute temperature of 77 K in each of the plurality of host molecules $20b$ is higher than energy of a lowest excited triplet state $T_1$ at an absolute temperature of 77 K in each of the plurality of organic semiconductor molecules $20a$.

An energy level $E_{S1}$ that is energy of the lowest excited singlet state $S_1$ is obtained as follows. First, a film composed of the plurality of organic semiconductor molecules $20a$ is formed on an Si wafer. In the case of performing film formation by an evaporation method, a film thickness is preferably 50 nm to 100 nm. In the case of performing film formation by a spin coating method, a film thickness may be approximately 30 nm. Next, a fluorescence spectrum of the film composed of the plurality of organic semiconductor molecules $20a$ is measured at normal temperature (absolute temperature of 300 K). In measurement of the fluorescence spectrum, an LED, a tungsten lamp, or a deuterium lamp is used as an excitation light source, and a multi-channel spectroscope (C10027, manufactured by HAMAMATSU PHOTONICS K.K.) is used as a detector. Next, a tangent line is drawn with respect to short-wavelength side rising of a light-emission spectrum in which the vertical axis represents optical intensity and the horizontal axis represents a wavelength, a wavelength value $\lambda_{edge}$ (nm) of an intersection between the tangent line and the horizontal axis is obtained, and the energy level $E_{S1}$ is obtained from the following Expression (1).

$$E_{S1} \text{ (eV)} = 1239.85/\lambda_{edge} \qquad (1)$$

Note that, the tangent line drawn with respect to the short-wavelength side rising of the fluorescence spectrum is a tangent line in which an inclination becomes a maximum value among tangent lines drawn at respective points of the fluorescence spectrum in a range from the short wavelength side of the fluorescence spectrum to a maximum value of the fluorescence spectrum appearing on the shortest wavelength side. A maximum value having peak intensity that is 10% or less of maximum peak intensity of the fluorescence spectrum does not become "the maximum value of the fluorescence spectrum appearing on the shortest wavelength side".

An energy level $E_{T1}$ that is energy of the lowest excited triplet state $T_1$ at an absolute temperature of 77 K is obtained as follows. First, an Si wafer (described above) on which the film composed of the plurality of organic semiconductor molecules $20a$ is formed is cooled down to the absolute temperature of 77 K by a cryostat (Optistat DN manufactured by Oxford Instruments). Next, in measurement of a phosphorescence spectrum, the same excitation light source and detector as in the measurement of the fluorescence spectrum are used, and a phosphorescence spectrum of the film composed of the plurality of organic semiconductor molecules $20a$ is measured. Next, a tangent line is drawn with respect to short-wavelength side rising of a phosphorescence spectrum in which the vertical axis represents optical intensity and the horizontal axis represents a wavelength, a wavelength value $\lambda_{edge}$ (nm) of an intersection between the tangent line and the horizontal axis is obtained, and the energy level $E_{T1}$ is obtained from the following Expression (2).

$$E_{T1} \text{ (eV)} = 1239.85/\lambda_{edge} \qquad (2)$$

Note that, the tangent line drawn with respect to the short-wavelength side rising of the phosphorescence spectrum is a tangent line in which an inclination becomes a maximum value among tangent lines drawn at respective points of the phosphorescence spectrum in a range from the short wavelength side of the phosphorescence spectrum to a maximum value of the phosphorescence spectrum appearing on the shortest wavelength side. A maximum value having peak intensity that is 10% or less of maximum peak intensity of the phosphorescence spectrum does not become "the maximum value of the phosphorescence spectrum appearing on the shortest wavelength side".

In each of the plurality of organic semiconductor molecules $20a$, the intersystem crossing rate constant $k_{ISC}$ from the lowest excited singlet state $S_1$ to the lowest excited triplet state $T_1$ is greater than the fluorescence rate constant $k^S_r$ from the lowest excited singlet state $S_1$ to the ground state $S_0$. In each of the plurality of organic semiconductor molecules $20a$, the intersystem crossing rate constant $k_{ISC}$ from the lowest excited singlet state $S_1$ to the lowest excited triplet state $T_1$ is greater than the reverse intersystem crossing rate constant $k_{RISC}$ from the lowest excited triplet state $T_1$ to the lowest excited singlet state $S_1$. In each of the plurality of organic semiconductor molecules $20a$, the intersystem crossing rate constant $k_{ISC}$ from the lowest excited singlet state $S_1$ to the lowest excited triplet state $T_1$ is two or more times the reverse intersystem crossing rate constant $k_{RISC}$ from the lowest excited triplet state $T_1$ to the lowest excited singlet state $S_1$. In each of the plurality of organic semiconductor molecules $20a$, the reverse intersystem crossing rate constant $k_{RISC}$ from the lowest excited triplet state $T_1$ to the lowest excited singlet state $S_1$ is $1 \times 10^7$ (sec$^{-1}$) or less. In each of the plurality of organic semiconductor molecules $20a$, the reverse intersystem crossing rate constant $k_{RISC}$ from the lowest excited triplet state $T_1$ to the lowest excited singlet state $S_1$ is greater than the non-radiative deactivation rate constant $k^T_{nr}$ from the lowest excited triplet state $T_1$ to the ground state $S_0$.

The fluorescence rate constant $k^S{}_r$ from the lowest excited singlet state $S_1$ to the ground state $S_0$, the intersystem crossing rate constant $k_{ISC}$ from the lowest excited singlet state $S_1$ to the lowest excited triplet state $T_1$, and the reverse intersystem crossing rate constant $k_{RISC}$ from the lowest excited triplet state $T_1$ to the lowest excited singlet state $S_1$ are obtained as follows. First, a film composed of the plurality of organic semiconductor molecules 20a is formed on a quartz substrate. In the case of performing film formation by an evaporation method, a film thickness is preferably 50 to 100 nm. In the case of performing film formation by a spin coating method, the film thickness may be approximately 30 nm. Next, a light-emission quantum yield (the number of light-emitting photons/the number of light-absorbing photons) of the film composed of the plurality of organic semiconductor molecules 20a is measured at normal temperature (300 K) by using an absolute PL quantum yield measuring instrument (C11347, manufactured by HAMAMATSU PHOTONICS K.K.). In the measurement, excitation is performed with light in an absorption wavelength band of the film composed of the plurality of organic semiconductor molecules 20a, a light-emission quantum yield is calculated from a light-emission spectrum detected under a condition in which absorbance ("Abs" in the measuring instrument) becomes 0.1 to 0.9, and an average value in measurement performed three times is set as "Φ".

Next, a fluorescence lifetime of the film composed of the plurality of organic semiconductor molecules 20a is measured by using a small-sized fluorescence lifetime measuring instrument (C11367, manufactured by HAMAMATSU PHOTONICS K.K.). In the measurement, excitation is performed with light in the absorption wavelength band of the film composed of the plurality of organic semiconductor molecules 20a, a peak wavelength of a light-emission spectrum obtained in measurement of a light-emission quantum yield is set as "detection wavelength". Note that, all measurements are performed in the number of times of integration so that a peak count becomes 10,000 or greater. In the film composed of the plurality of organic semiconductor molecules 20a, among a lifetime of prompt fluorescence component ($\tau_p$) that emits light from the lowest excited singlet state $S_1$ without through the lowest excited triplet state $T_1$, an intersystem crossing rate from the lowest excited singlet state $S_1$ to the lowest excited triplet state $T_1$, and a lifetime of delay fluorescence component ($\tau_d$) that emits light after through reverse intersystem crossing from the lowest excited triplet state $T_1$ to the lowest excited singlet state $S_1$, at least two components are measured. However, it is necessary to perform measurement in a time range suitable for each time scale, and thus measurement is performed in the following procedure.

First, a fluorescence lifetime is measured in a time range in which $\tau_d$ (sec) can be measured in the film composed of the plurality of organic semiconductor molecules 20a. Since it is necessary to view a time-resolved light-emission waveform of excitation light when calculating reasonable $\tau_d$, Spectron (standard diffusion reflection plate) is set as a measurement target, and an instrument response function (IRF) is measured under the same measurement conditions (an excitation wavelength, a repetition frequency, and a time range) as in the measurement of the fluorescence lifetime. Next, $1^{st}$ order "Tail fit" (exponential function fitting of a single component) in a measurement instrument is performed with respect to a previously measured molecular light-emission decay curve, and $\tau_d$ (sec) is calculated. With regard to a calculation range when performing the Tail fit, after performing measurement in a time range sufficiently wider than an excitation pulse obtained in the IRF measurement, calculation is performed in a time region capable of obtaining S/N of light-emission intensity (a region in which an average value of light-emission intensity of 21 points including 10 point before and after time of interest is greater by 5 counts with respect to a dark level) after a late time between time when a light-emission decay curve of a prompt component is sufficiently attenuated or after time when excitation pulse light is attenuated to a dark level.

Next, in order to calculate $\tau_p$, measurement on the film composed of the plurality of organic semiconductor molecules 20a is performed in a time range (for example, one microsecond) in which time resolution of the light-emission curve of the prompt component can be sufficiently secured, and a light-emission decay curve of a delay component is also included. Next, the IRF is measured under the same conditions with Spectron set as a measurement target, a multi-component exponential function fitting is performed with previously obtained $\tau_p$ set as a fixed parameter, and $\tau_p$ (sec), and the prompt and delay components are calculated. Note that, with regard to the prompt component, a light-emission decay process of two or more components may be included due to intermolecular interaction. In this case, fitting is performed with three or more components including the prompt and delay components, but light-emission decay without through reverse intersystem crossing is defined as a prompt component and is calculated. A fitting method conforms to a method described in manual of C11367.

Since a prompt component $\Phi_p$ and a delay component $\Phi_d$ of the light-emission quantum yield ($\Phi=\Phi_p+\Phi_d$), and a prompt component $\tau_p$ and a delay component $\tau_d$ of the fluorescence lifetime are obtained through the above-described measurement, various rate constants ($k^S{}_r$, $k_{ISC}$, $k_{RISC}$, and $k^T{}_{nr}$) are calculated by the following Expressions (3) to (8) (however, non-radiative deactivation from the lowest excited singlet state $S_1$ is ignored).

$$\tau_p = 1/k_p \tag{3}$$

$$\tau_d = 1/k_d \tag{4}$$

$$k^S{}_r = \Phi_p k_p \tag{5}$$

$$k_{ISC} = (1 - \Phi_p) k_p \tag{6}$$

$$k_{RISC} = (k_p k_d \Phi_d)/(k_{ISC} \Phi_p) \tag{7}$$

$$k^T{}_{nr} = k_d - \Phi_p k_{RISC} \tag{8}$$

Note that, in a case where an ideal molecular design as a modulation material is realized, $k^S{}_r$ is expected to be significantly lower than $k_{ISC}$, and as a result, light-emission intensity of the prompt component is attenuated, and $T_1$ generation efficiency increases. Under this condition, in a case where $k_{RISC}$ is small and a non-radiative deactivation rate constant $k^T{}_{nr}$ from $T_1$ is significantly smaller than $k_{RISC}$, a very long light-emission lifetime is observed. In the case of this condition, sufficient S/N for rate constant calculation may not be obtained in fluorescence lifetime measurement, but this is a phenomenon that can be regarded as convergence to ideal conditions ($k_{RISC} \to 0$). In addition, in a polar organic semiconductor molecules having a dipole moment of 0 D or greater, since a phenomenon in which excited molecules formed by photoexcitation in a film does not contribute to light-emission and is spontaneously decomposed to charges may occur, there is a possibility that the components are not measured as light-emission, and sufficient S/N for rate constant calculation may not be obtained in the fluorescence lifetime measurement.

A dipole moment ($\mu$) of each of the plurality of organic semiconductor molecules 20a is greater than 0 D. The dipole moment is a value that can be calculated by quantum chemistry calculation, and is a value that is typically calculated by a calculation method called a Hartree-Fock (HF) method or a density functional theory (DFT) method. Among these, the most commonly used condition (a combination of the functional theory and a basis function) is B3LYP/6-31(d).

Examples of the organic semiconductor molecules 20a that satisfy the above-described conditions include TADF molecule such as TPA-DCPP, 4CzIPN, and 4CzTPN. The TADF molecule is a molecule that is known in a light-emission field, but can be used as the organic semiconductor molecules 20a that satisfy the above-described conditions. The organic semiconductor molecules 20a is designed by quantum chemistry calculation or the like so as to satisfy the above-described conditions, and is generated by organic synthesis. Note that, examples of the host molecules 20b that satisfy the above-described conditions include CBP, mCBP, T2T, mCP, PPT, DPEPO, and the like.

In the organic modulation layer 20 configured as described above, an excited state enabling reverse intersystem crossing from the lowest excited triplet state $T_1$ to the lowest excited singlet state $S_1$ is formed in each of the plurality of organic semiconductor molecules 20a due to irradiation with the input light L1. According to this, in each of the plurality of organic semiconductor molecules 20a, in addition to high-speed charge separation observed until the lowest excited singlet state $S_1$ is mitigated, charge separation from the lowest excited triplet state $T_1$ having a longer lifetime in comparison to the lowest excited singlet state $S_1$ (hereinafter, referred to as "direct charge separation from lowest excited triplet state $T_1$"), and/or charge separation from the lowest excited singlet state $S_1$ in which the lowest excited triplet state $T_1$ having a longer lifetime in comparison to the lowest excited singlet state $S_1$ is set as a temporary shelter from deactivation (hereinafter, referred to as "charge separation from the lowest excited singlet state $S_1$ through the lowest excited triplet state $T_1$") occur.

Figure 3A:
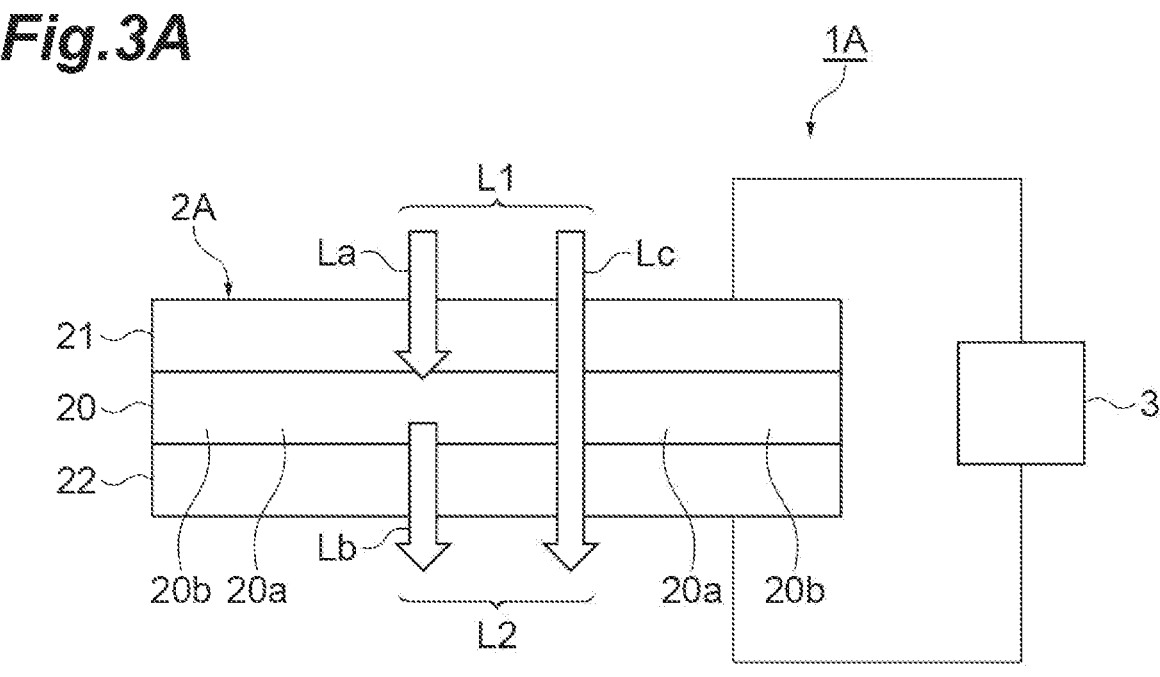
FIGS. 3A and 3B are configuration diagrams illustrating an operation of the modulation device illustrated in FIG. 1.

In the modulation device 1A, characteristics of the organic modulation layer 20 are used, and the input light L1 is modulated as follows. As illustrated in FIG. 3A, in a state in which a voltage is not applied between the first electrode 21 and the second electrode 22 by the controller 3, and an electric field in a direction of causing charge separation does not occur in the organic modulation layer 20, when the input light L1 is incident to the organic modulation layer 20 through the first electrode 21, a light beam La included in the input light L1 is absorbed to the organic modulation layer 20, and a light beam Lb is emitted to the outside due to spontaneous emission through the second electrode 22. At this time, a light beam Lc included in the input light L1 is not absorbed to the organic modulation layer 20 and is emitted to the outside through the second electrode 22. Accordingly, in this case, output light L2 including the light beam Lb and the light beam Lc is obtained. Note that, the light beam La, the light beam Lb, and the light beam Lc are light beams of wavelength bands different from each other.

Figure 3B:
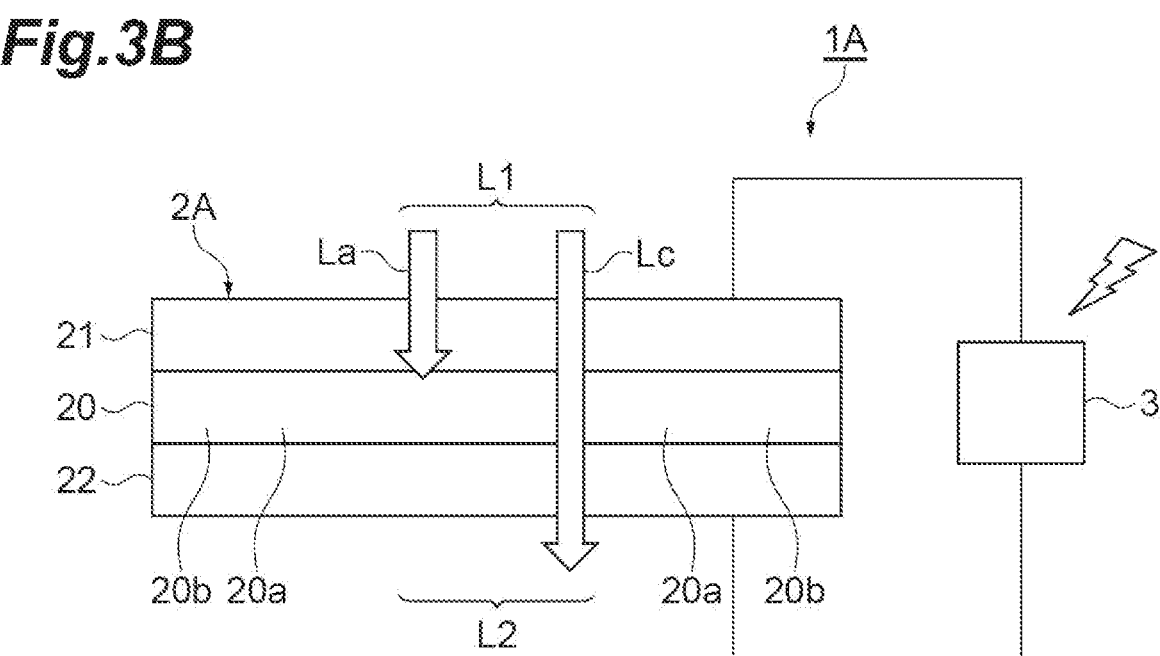

As illustrated in FIG. 3B, in a state in which a voltage is applied between the first electrode 21 and the second electrode 22 by the controller 3, and an electric field in a direction of causing charge separation occurs in the organic modulation layer 20, when the input light L1 is incident to the organic modulation layer 20 through the first electrode

21, the light beam La included in the input light L1 is absorbed to the organic modulation layer 20, but molecules in an excited state are attenuated due to charge separation, and thus the light beam Lb (refer to FIG. 3A) is not generated. At this time, the light beam Lc included in the input light L1 is not absorbed to the organic modulation layer 20, and is emitted to the outside through the second electrode 22. Accordingly, in this case, output light L2 that does not include the light beam Lb and includes the light beam Lc is obtained. Note that, when increasing a value (absolute value) of the voltage that causes an electric field in a direction of causing charge separation to occur in the organic modulation layer 20, a ratio of the light beam Lb included in the output light L2 can be reduced, and when decreasing the value of the voltage, a ratio of the light beam Lb included in the output light L2 can be increased.

As described above, in the organic modulation element 2A, an excited state enabling reverse intersystem crossing from the lowest excited triplet state $T_1$ the lowest excited singlet state $S_1$ is formed in each of the plurality of organic semiconductor molecules 20a due to irradiation with the input light L1 transmitted through the first electrode 21. According to this, with respect to each of the plurality of organic semiconductor molecules 20a, in addition to high-speed charge separation observed until the lowest excited singlet state $S_1$ is mitigated, direct charge separation from the lowest excited triplet state $T_1$, and/or charge separation from the lowest excited singlet state $S_1$ through the lowest excited triplet state $T_1$ become possible. Here, in each of the plurality of organic semiconductor molecules 20a, since the intersystem crossing rate constant $k_{ISC}$ from the lowest excited singlet state $S_1$ to the lowest excited triplet state $T_1$ is greater than the reverse intersystem crossing rate constant $k_{RISC}$ from the lowest excited triplet state $T_1$ to the lowest excited singlet state $S_1$, the lifetime of the lowest excited triplet state $T_1$ is lengthened, and thus sufficient charge separation is likely to be obtained. Accordingly, for example, when a voltage is applied between the first electrode 21 and the second electrode 22 under irradiation with the input light L1 to cause an electric field in a direction of causing charge separation to occur in the organic modulation layer 20, an excited state in which deactivation (spontaneous emission) is to originally occur according to light-emission is converted into a charge separation state, and thus attenuation is possible. On the other hand, in each of the plurality of organic semiconductor molecules 20a, since the reverse intersystem crossing rate constant $k_{RISC}$ from the lowest excited triplet state $T_1$ to the lowest excited singlet state $S_1$ is greater than the non-radiative deactivation rate constant $k^T_{nr}$ from the lowest excited triplet state $T_1$ to the ground state $S_0$, deactivation due to heat is less likely to occur, and light-emission is likely to be obtained. Accordingly, for example, when a voltage is not applied between the first electrode 21 and the second electrode 22, and an electric field in a direction of causing charge separation is not caused to occur in the organic modulation layer 20, light-emission due to spontaneous emission can be promoted. As described above, according to the organic modulation element 2A, the input light L1 can be modulated in correspondence with a purpose.

According to the organic modulation element 2A, in each of the plurality of organic semiconductor molecules 20a, a difference between energy of the lowest excited singlet state $S_1$ and energy of the lowest excited triplet state $T_1$ at an absolute temperature of 77 K is less than 0.3 eV. According to this, the individual organic semiconductor molecules 20a can be caused to function as molecules in which an excited state enabling reverse intersystem crossing from the lowest excited triplet state $T_1$ to the lowest excited singlet state $S_1$ is formed due to irradiation with the input light L1.

According to the organic modulation element 2A, in each of the plurality of organic semiconductor molecules 20$a$, the intersystem crossing rate constant $k_{ISC}$ from the lowest excited singlet state $S_1$ to the lowest excited triplet state $T_1$ is greater than the fluorescence rate constant $k^S_r$ from the lowest excited singlet state $S_1$ to the ground state $S_0$. According to this, direct charge separation from the lowest excited triplet state $T_1$ and/or charge separation from the lowest excited singlet state $S_1$ through the lowest excited triplet state $T_1$ become possible while suppressing deactivation from the lowest excited singlet state $S_1$ due to light-emission.

According to the organic modulation element 2A, in each of the plurality of organic semiconductor molecules 20$a$, the intersystem crossing rate constant $k_{ISC}$ from the lowest excited singlet state $S_1$ to the lowest excited triplet state $T_1$ is two or times the reverse intersystem crossing rate constant $k_{RISC}$ from the lowest excited triplet state $T_1$ to the lowest excited singlet state $S_1$. According to this, the lifetime of the lowest excited triplet state $T_1$ is lengthened, and thus photoelectric conversion efficiency can be improved.

According to the organic modulation element 2A, in each of the plurality of organic semiconductor molecules 20$a$, the reverse intersystem crossing rate constant $k_{RISC}$ from the lowest excited triplet state $T_1$ to the lowest excited singlet state $S_1$ is $1\times10^7$ ($sec^{-1}$) or less. According to this, the lifetime of the lowest excited triplet state $T_1$ is lengthened, and thus photoelectric conversion efficiency can be improved.

According to the organic modulation element 2A, a dipole moment of each of the plurality of organic semiconductor molecules 20$a$ is greater than 0 D. According to this, energy for charge separation can be reduced.

According to the organic modulation element 2A, energy of the lowest excited triplet state $T_1$ at an absolute temperature of 77 K in each of the plurality of host molecules 20$b$ is higher than energy of the lowest excited triplet state $T_1$ at an absolute temperature of 77 K in each of the plurality of organic semiconductor molecules 20$a$. According to this, transition of excited molecules from the lowest excited triplet state $T_1$ of the organic semiconductor molecules 20$a$ to the lowest excited triplet state $T_1$ of the host molecules 20$b$, and a loss path of the host molecules 20$b$ in the lowest excited triplet state $T_1$ in a case where an excited state is reformed due to recoupling of charges generated by charge separation are suppressed. That is, it is possible to suppress a decrease in photoelectric conversion efficiency due to an influence of the plurality of host molecules 20$b$.

In the organic modulation element 2A, the second electrode 22 has light-transmitting property with respect to the output light L2 from the organic modulation layer 20. According to this, the modulated output light L2 can be allowed to be emitted to a side opposite to an incident side of the input light L1.

In the modulation device 1A, the controller 3 modulates a voltage that is applied between the first electrode 21 and the second electrode 22. According to this, the input light L1 can be modulated in correspondence with a purpose.

Figure 4:
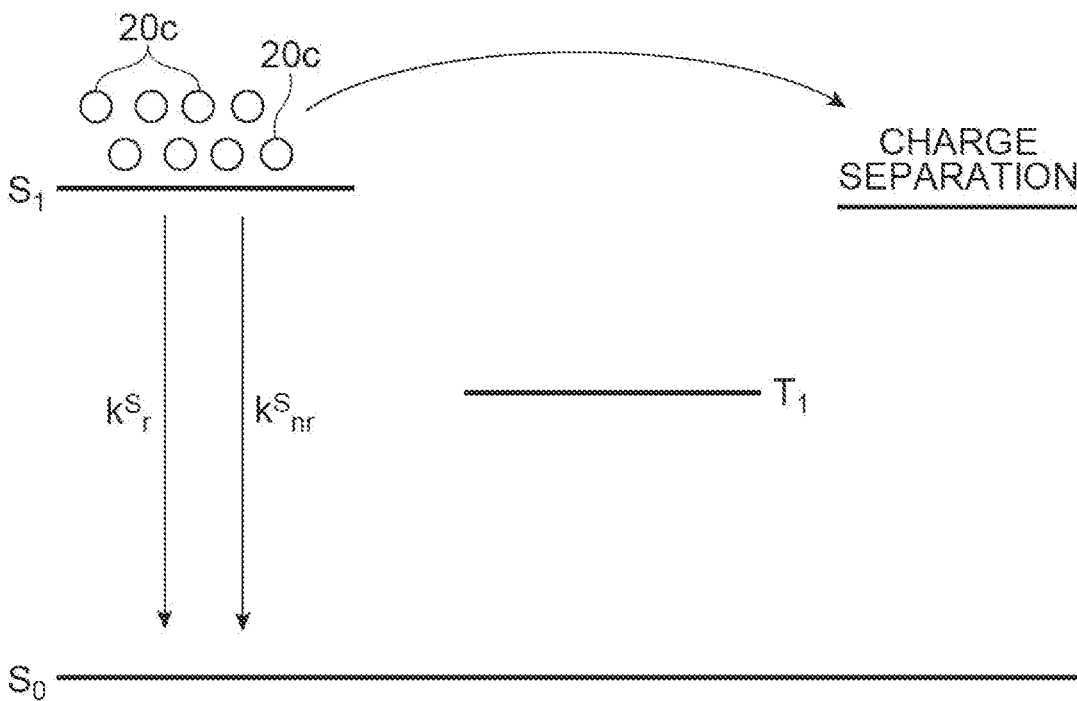
FIG. 4 is an energy diagram of an organic modulation layer according to a comparative example.

FIG. 4 is an energy diagram of an organic modulation layer according to a comparative example. The organic modulation layer according to the comparative example illustrated in FIG. 4 includes a plurality of organic semiconductor molecules 20$c$. The organic semiconductor molecules 20$c$ are fluorescent molecules (for example, Alq3 or the like). In the organic modulation layer according to the comparative example illustrated in FIG. 4, a difference between the energy of the lowest excited singlet state $S_1$ and the energy of the lowest excited triplet state $T_1$ at an absolute temperature of 77 K is large, and even when being irradiated with light, intersystem crossing from the lowest excited singlet state $S_1$ to the lowest excited triplet state $T_1$ does not occur in the individual organic semiconductor molecules 20$c$. Therefore, neither direct charge separation from the lowest excited triplet state $T_1$ nor charge separation from the lowest excited singlet state $S_1$ through the lowest excited triplet state $T_1$ occurs. Accordingly, in the organic modulation layer according to the comparative example illustrated in FIG. 4, a dissociation effect to charges decreases, and components which are lost as light or heat are increased. As a result, the organic modulation layer according to the comparative example illustrated in FIG. 4 does not function as an effective modulation layer.

Figure 5:
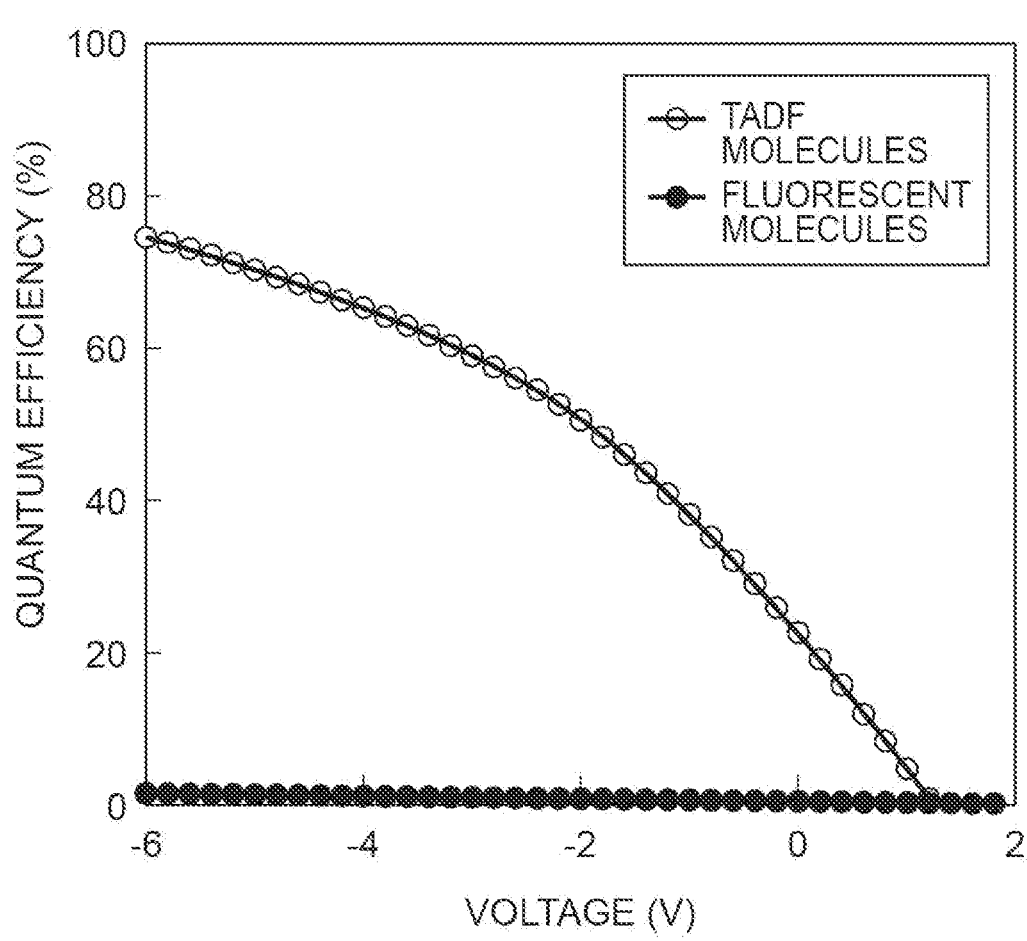
FIG. 5 is a graph showing voltage dependence of a quantum efficiency with respect to the organic modulation layer that includes a plurality of TADF molecules according to an example, and the organic modulation layer that includes a plurality of fluorescent molecules according to the comparative example.

FIG. 5 is a graph showing voltage dependence of a quantum efficiency with respect to the organic light-receiving layer that includes a plurality of TADF molecules according to the example, and the organic light-receiving layer that includes a plurality of fluorescent molecules according to the comparative example. In FIG. 5, "quantum efficiency" is a ratio of "the number of electrons detected from the organic light-receiving layer" to "the number of photons absorbed by the organic light-receiving layer". In addition, "voltage" is a voltage that is applied to the organic light-receiving layer at the time of irradiation with light, and a negative value is a value that causes an electric field in a direction of causing charge separation to occur in the organic light-receiving layer (the same shall apply hereinafter). As shown in FIG. 5, in the organic light-receiving layer including the plurality of TADF molecules according to the example, the quantum efficiency becomes higher and a variation rate of the quantum efficiency with respect to a voltage becomes larger in comparison to the organic light-receiving layer including the plurality of fluorescent molecules according to the comparative example. This represents that the organic light-receiving layer according to the example functions as an effective modulation layer.

Second Embodiment

Figure 6A:
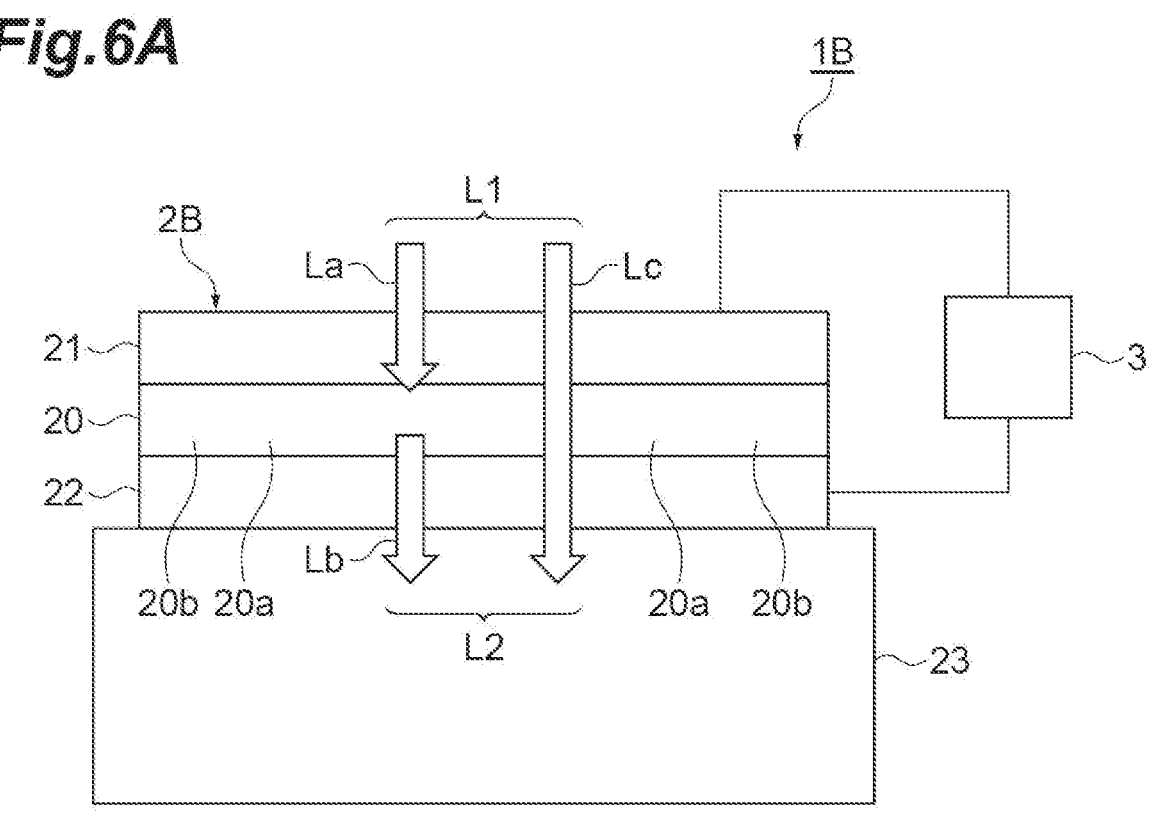
FIGS. 6A and 6B are configuration diagrams illustrating an operation of a modulation device according to a second embodiment.
Figure 6B:
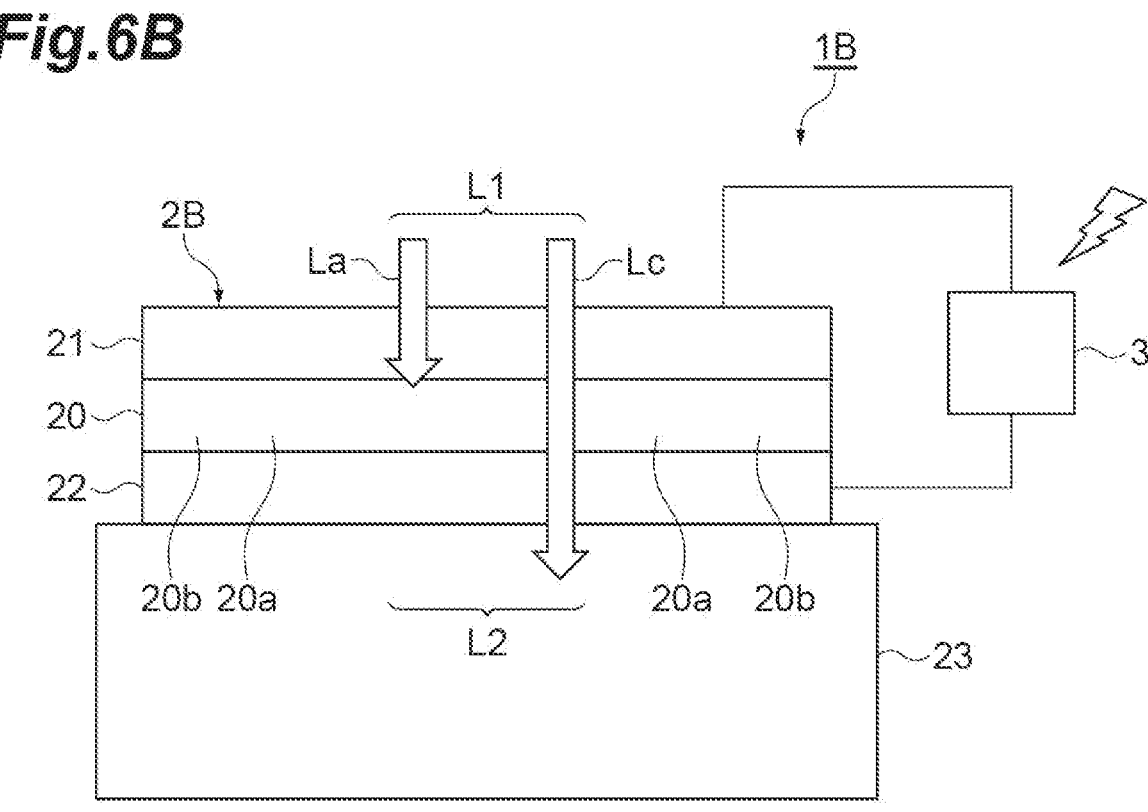

As illustrated in FIGS. 6A and 6B, a modulation device 1B according to a second embodiment is different from the modulation device 1A according to the first embodiment in that an organic modulation element 2B includes a light-receiving layer 23. The organic modulation element 2B according to the second embodiment includes the organic modulation layer 20, the first electrode 21 disposed on one side of the organic modulation layer 20, the second electrode 22 disposed on the other side of the organic modulation layer 20, and the light-receiving layer 23 disposed on the other side of the second electrode 22. The light-receiving layer 23 receives output light L2. For example, the light-receiving layer 23 constitutes a PD, and charges generated by reception of the output light L2 are detected as a current signal from an electrode (not illustrated) that is electrically connected to the light-receiving layer 23.

According to the organic modulation element 2B configured as described above, input light L1 is modulated in correspondence with a purpose, and the output light L2 modulated in correspondence with the purpose can be detected.

Specifically, as illustrated in FIG. 6A, in a state in which a voltage is not applied between the first electrode 21 and the second electrode 22 by the controller 3, and an electric field in a direction of causing charge separation does not occur in the organic modulation layer 20, when the input light L1 is incident to the organic modulation layer 20 through the first electrode 21, the light beam La included in the input light L1 is absorbed to the organic modulation layer 20 and light-emission due to charge separation spontaneous emission in the organic modulation layer 20 occurs, and a light beam Lb is incident to the light-receiving layer 23 through the second electrode 22. At this time, a light beam Lc included in the input light L1 is not absorbed to the organic modulation layer 20 and is incident to the light-receiving layer 23 through the second electrode 22. Accordingly, in this case, output light L2 including the light beam Lb and the light beam Lc is detected.

As illustrated in FIG. 6B, in a state in which a voltage is applied between the first electrode 21 and the second electrode 22 by the controller 3, and an electric field in a direction of causing charge separation occurs in the organic modulation layer 20, when the input light L1 is incident to the organic modulation layer 20 through the first electrode 21, the light beam La included in the input light L1 is absorbed to the organic modulation layer 20, and thus charge separation occurs in the organic modulation layer 20, but light-emission due to spontaneous emission does not occur, and the light beam Lb (refer to FIG. 6A) is not generated. At this time, the light beam Lc included in the input light L1 is not absorbed to the organic modulation layer 20, and is incident to the light-receiving layer 23 through the second electrode 22. Accordingly, in this case, the output light L2 that does not include the light beam Lb and includes the light beam Lc is detected. In this manner, in a state in which a voltage is applied between the first electrode 21 and the second electrode 22, the light beam La included in the input light L1 can be detected by the organic modulation layer 20, and the light beam Lc included in the input light L1 can be detected by the light-receiving layer 23. Note that, when increasing a value (absolute value) of the voltage that causes an electric field in a direction causing charge separation to occur in the organic modulation layer 20, a ratio of the light beam Lb included in the output light L2 can be reduced, and when decreasing the value of the voltage, a ratio of the light beam Lb included in the output light L2 can be increased.

Figure 7:
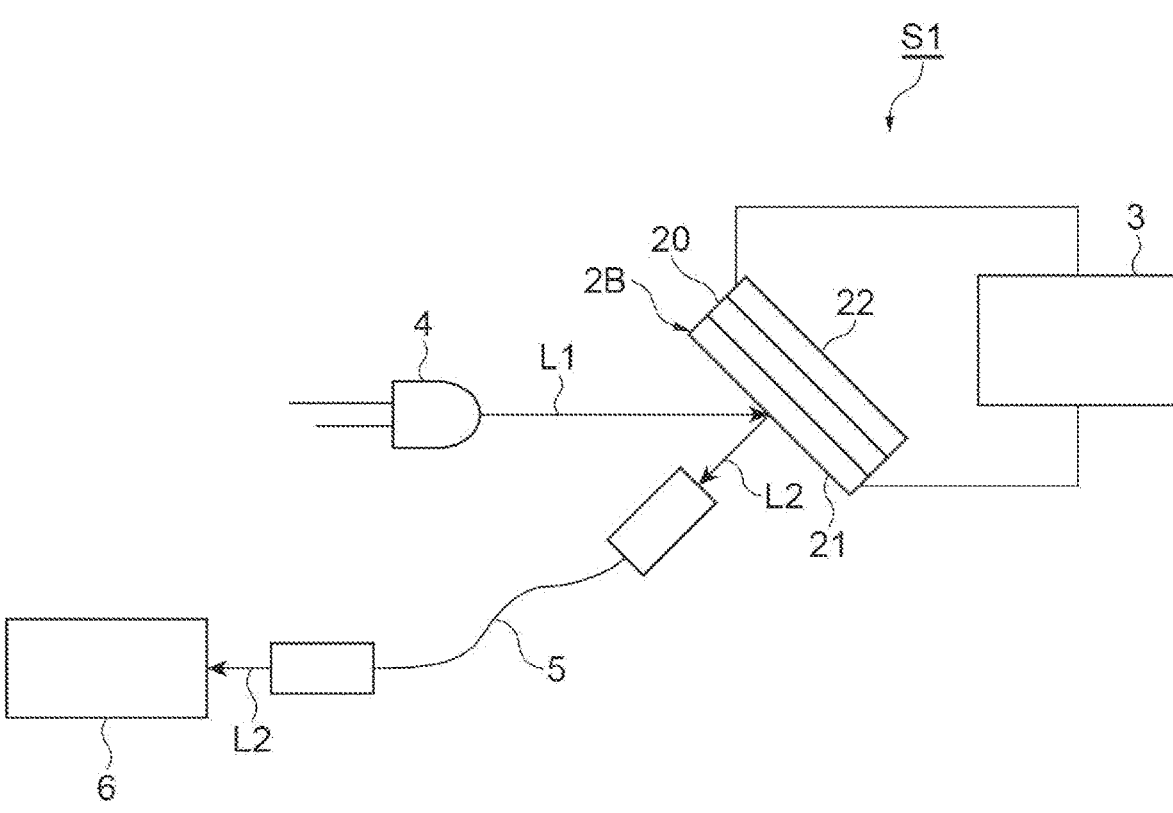
FIG. 7 is a configuration diagram of a system for verifying a function of the modulation device according to the second embodiment.

FIG. 7 is a configuration diagram of a system S1 configured to verify a function of a modulation device 1B according to the second embodiment. In the system S1, an element in which the organic modulation layer 20 containing TPA-DCPP (the plurality of organic semiconductor molecules 20a) and CBP (the plurality of host molecules 20b) in a mass ratio of 50:50 is disposed between the first electrode 21 and the second electrode 22 is used as the organic modulation element 2B. As a material of the first electrode 21, a material having a light-transmitting property with respect to the input light L1 and the output light L2 is used. As a material of the second electrode 22, a material that reflects the input light L1 and the output light L2 is used. In the system S1, the input light L1 emitted from an LED 4 is incident to the organic modulation layer 20 through the first electrode 21. In addition, the output light L2 emitted from the organic modulation layer 20 to the outside through the first electrode 21 is incident to an SiPD 6 through an optical fiber 5.

Figure 8A:
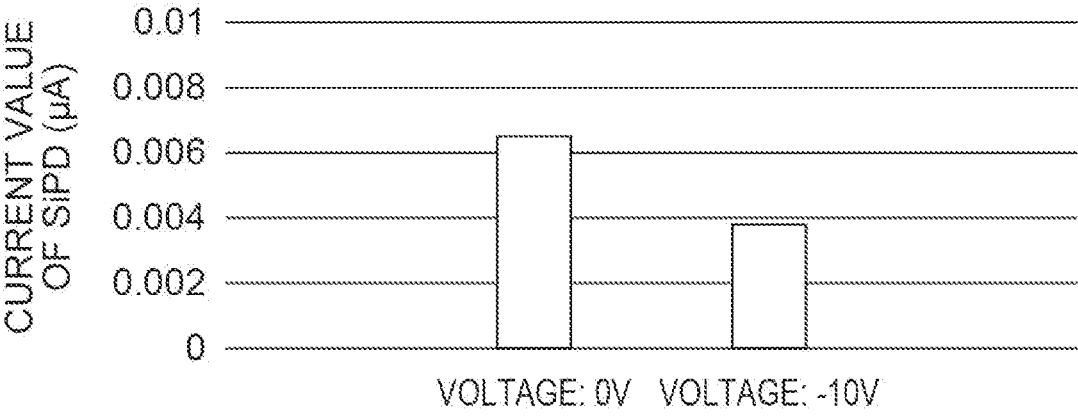
FIGS. 8A and 8B are graphs showing verification results relating to the function of the modulation device according to the second embodiment.
Figure 8B:
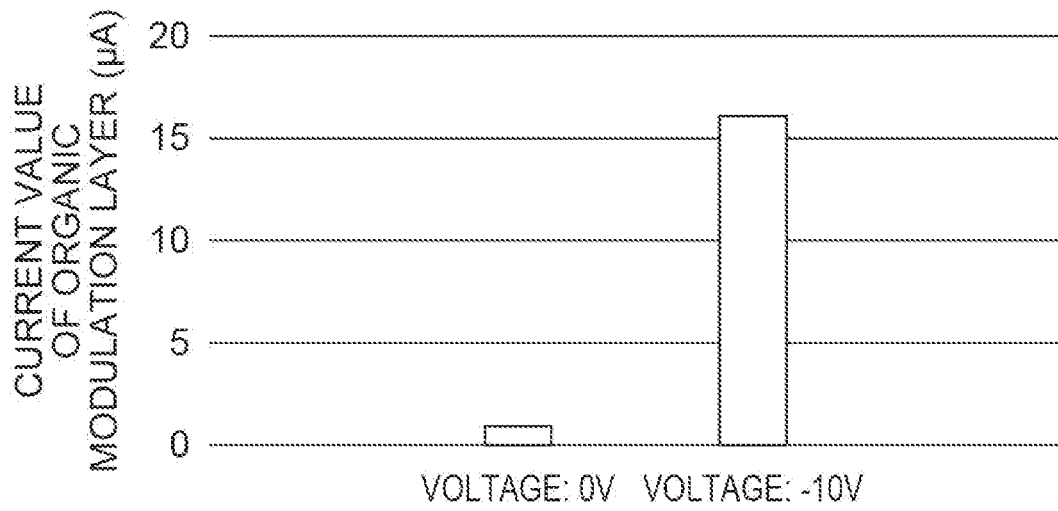

The following results are obtained through verification in the system S1. As shown in FIG. 8A, a current value detected by the SiPD 6 in a state in which a voltage is not applied between the first electrode 21 and the second electrode 22 is greater than a current value detected by the SiPD 6 in a state in which a voltage is applied between the first electrode 21 and the second electrode 22. In contrast, as shown in FIG. 8B, a current value detected by the organic modulation layer 20 in a state in which a voltage is applied between the first electrode 21 and the second electrode 22 is greater than a current value detected by the organic modulation layer 20 in a state in which a voltage is not applied between the first electrode 21 and the second electrode 22. The results represent that the modulation device 1B according to the second embodiment appropriately functions.

Third Embodiment

Figure 9A:
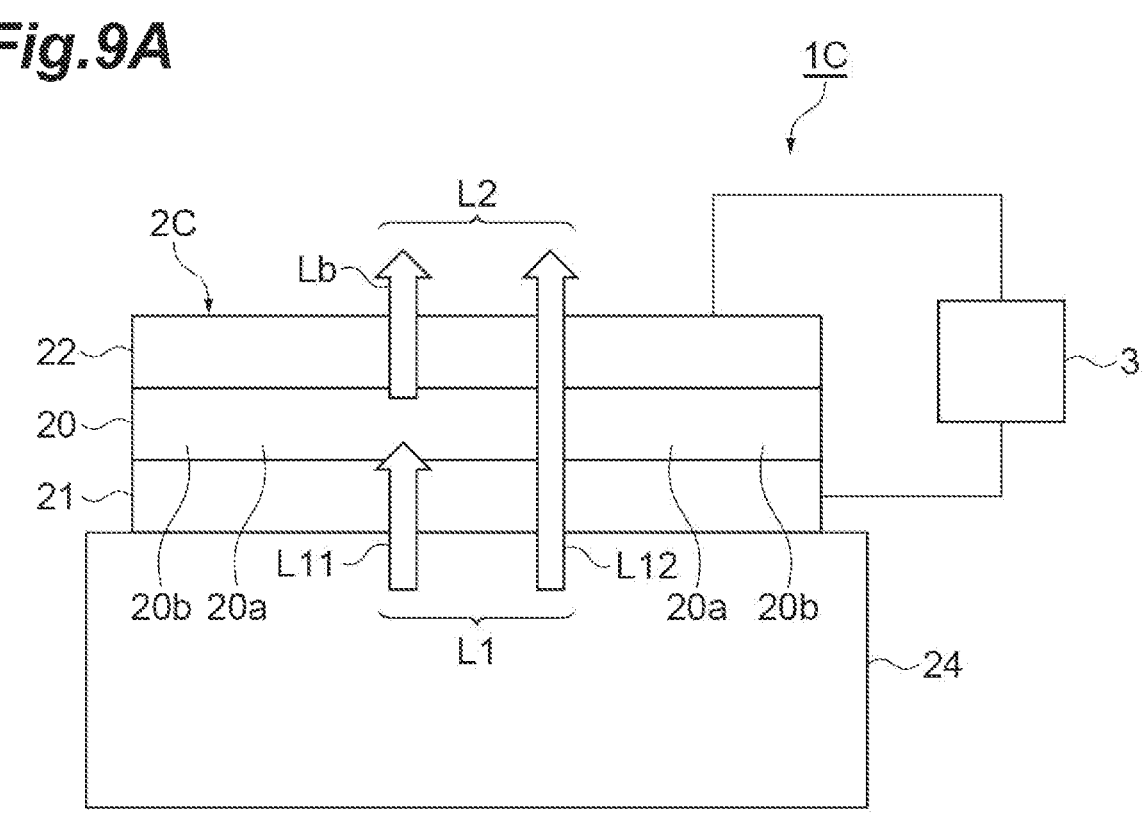
FIGS. 9A and 9B are configuration diagrams illustrating an operation of a modulation device according to a third embodiment.
Figure 9B:
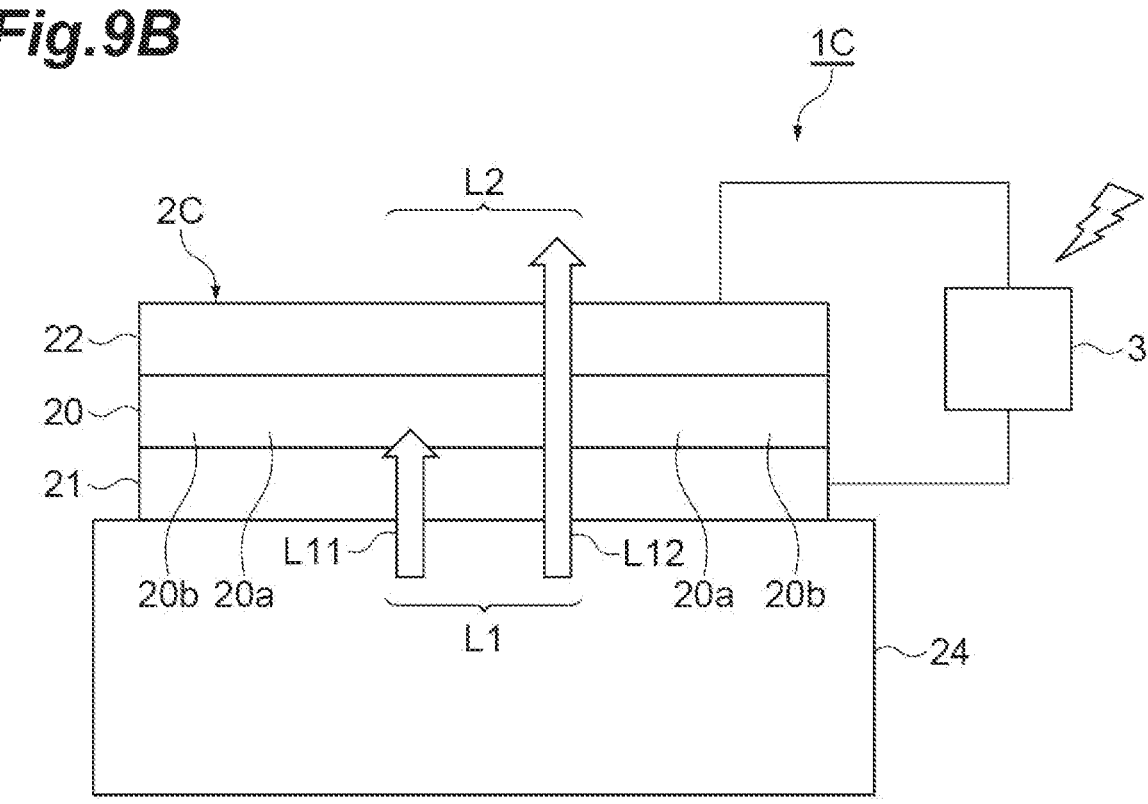

As illustrated in FIGS. 9A and 9B, a modulation device 1C according to a third embodiment is different from the modulation device 1A according to the first embodiment in that an organic modulation element 2C includes a light-emitting layer 24. The organic modulation element 2C according to the third embodiment includes the organic modulation layer 20, the first electrode 21 disposed on one side of the organic modulation layer 20, the second electrode 22 disposed on the other side of the organic modulation layer 20, and the light-emitting layer 24 disposed on one side of the first electrode 21. The light-emitting layer 24 emits input light L1. For example, the light-emitting layer 24 constitutes an LED.

According to the organic modulation element 2C configured as described above, input light L1 is modulated in correspondence with a purpose, and output light L2 modulated in correspondence with the purpose can be emitted.

Specifically, as illustrated in FIG. 9A, in a state in which a voltage is not applied between the first electrode 21 and the second electrode 22 by the controller 3, and an electric field in a direction of causing charge separation does not occur in the organic modulation layer 20, when the input light L1 is emitted from the light-emitting layer 24 and is incident to the organic modulation layer 20 through the first electrode 21, a partial light beam L11 in the input light L1 is absorbed to the organic modulation layer 20, and thus light-emission due to charge separation and spontaneous emission occurs in the organic modulation layer 20, and a light beam Lb is emitted to the outside through the second electrode 22. At this time, the remaining light beam L12 in the input light L1 is not absorbed to the organic modulation layer 20, and is emitted to the outside through the second electrode 22. Accordingly, in this case, the output light L2 including a light beam Lb and the light beam L12 is emitted to the outside.

As illustrated in FIG. 9B, in a state in which a voltage is applied between the first electrode 21 and the second electrode 22 by the controller 3, and an electric field in a direction of causing charge separation occurs in the organic modulation layer 20, when the input light L1 is emitted from the light-emitting layer 24 and the input light L1 is incident to the organic modulation layer 20 through the first electrode 21, the partial light beam L11 in the input light L1 is absorbed to the organic modulation layer 20, and thus charge separation occurs in the organic modulation layer 20, but light-emission due to spontaneous emission does not occur, and the light beam Lb (refer to FIG. 9A) does not occur. At this time, the remaining light beam L12 in the input light L1 is not absorbed to the organic modulation layer 20, and is emitted to the outside through the second electrode 22. Accordingly, in this case, output light L2 that does not include the light beam Lb and includes the light beam L12 is emitted to the outside. Note that, when increasing a value (absolute value) of the voltage that causes an electric field in a direction of causing charge separation to occur in the organic modulation layer 20, a ratio of the light beam Lb included in the output light L2 can be reduced, and when decreasing the value of the voltage, a ratio of the light beam Lb included in the output light L2 can be increased.

Figure 10:
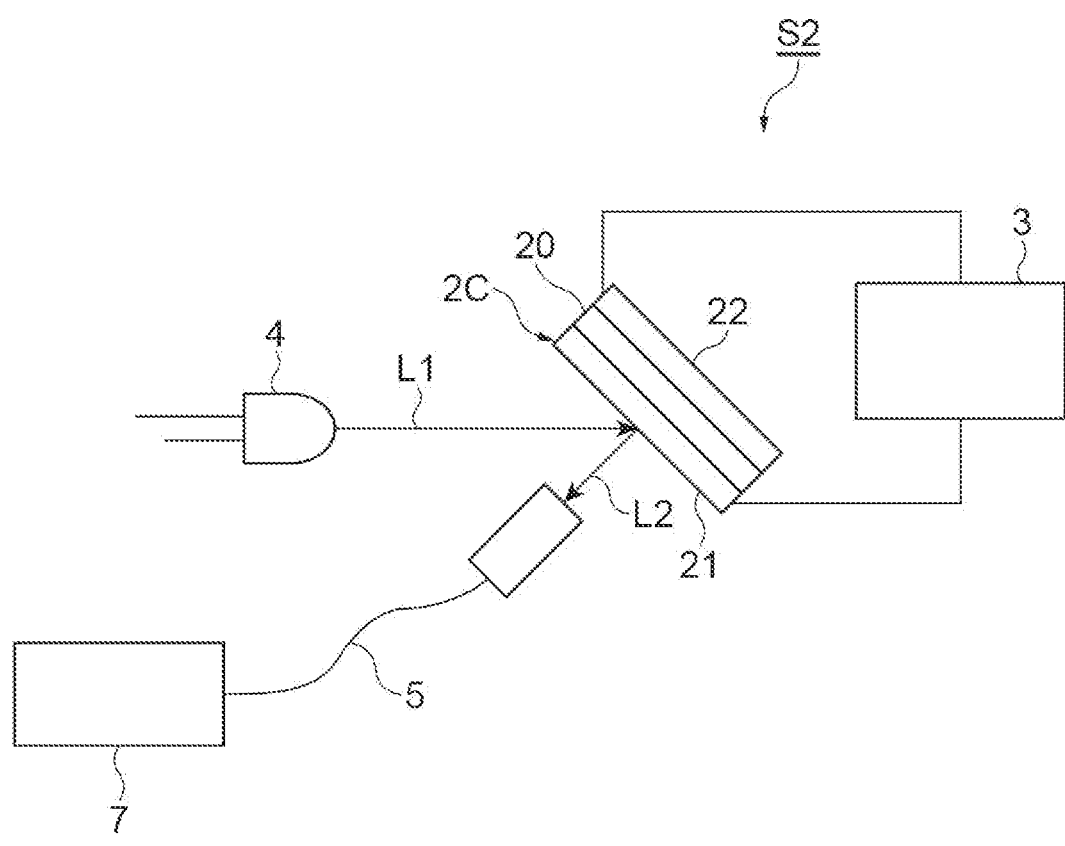
FIG. 10 is a configuration diagram of a system for verifying a function of the modulation device according to the third embodiment.

FIG. 10 is a configuration diagram of a system S2 configured to verify a function of the modulation device 1C according to the third embodiment. In the system S2, an element in which the organic modulation layer 20 containing TPA-DCPP (the plurality of organic semiconductor molecules 20a) and CBP (the plurality of host molecules 20b) in a mass ratio of 50:50 is disposed between the first electrode 21 and the second electrode 22 is used as the organic modulation element 2C. As a material of the first electrode 21, a material having a light-transmitting property with respect to the input light L1 and the output light L2 is used. As a material of the second electrode 22, a material that reflects the input light L1 and the output light L2 is used. In the system S2, the input light L1 emitted from an LED 4 is incident to the organic modulation layer 20 through the first electrode 21. In addition, the output light L2 emitted from the organic modulation layer 20 to the outside through the first electrode 21 is incident to a spectrometer 7 through the optical fiber 5.

Figure 11A:
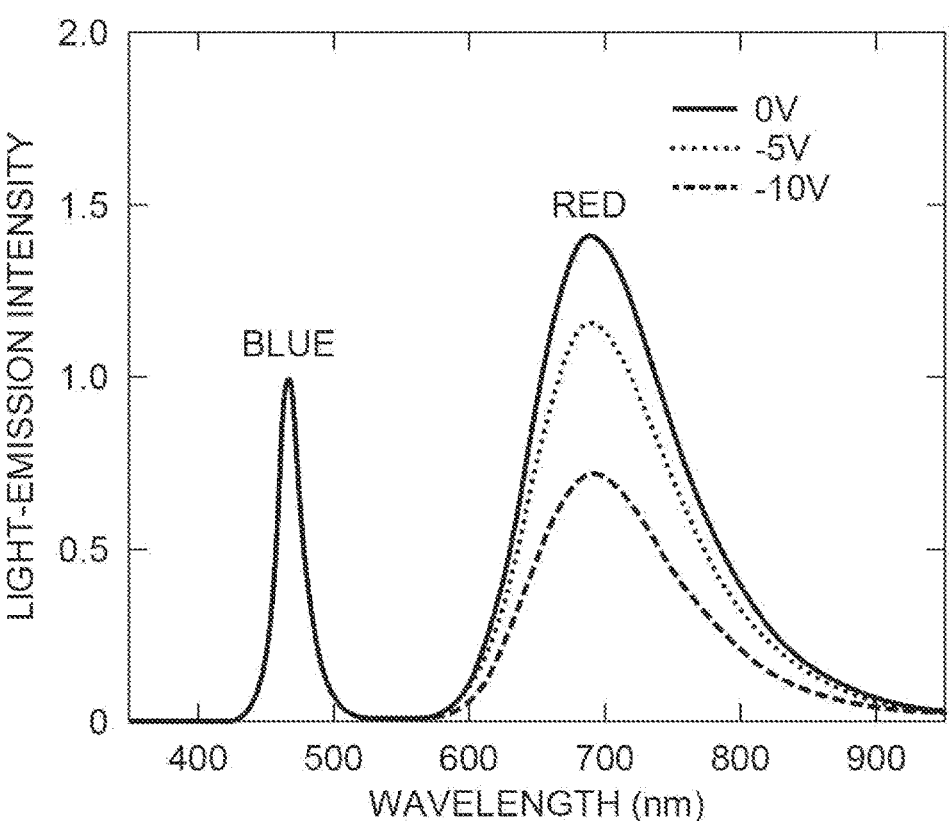
FIGS. 11A and 11B are graphs showing verification results relating to the function of the modulation device according to the third embodiment.
Figure 11B:
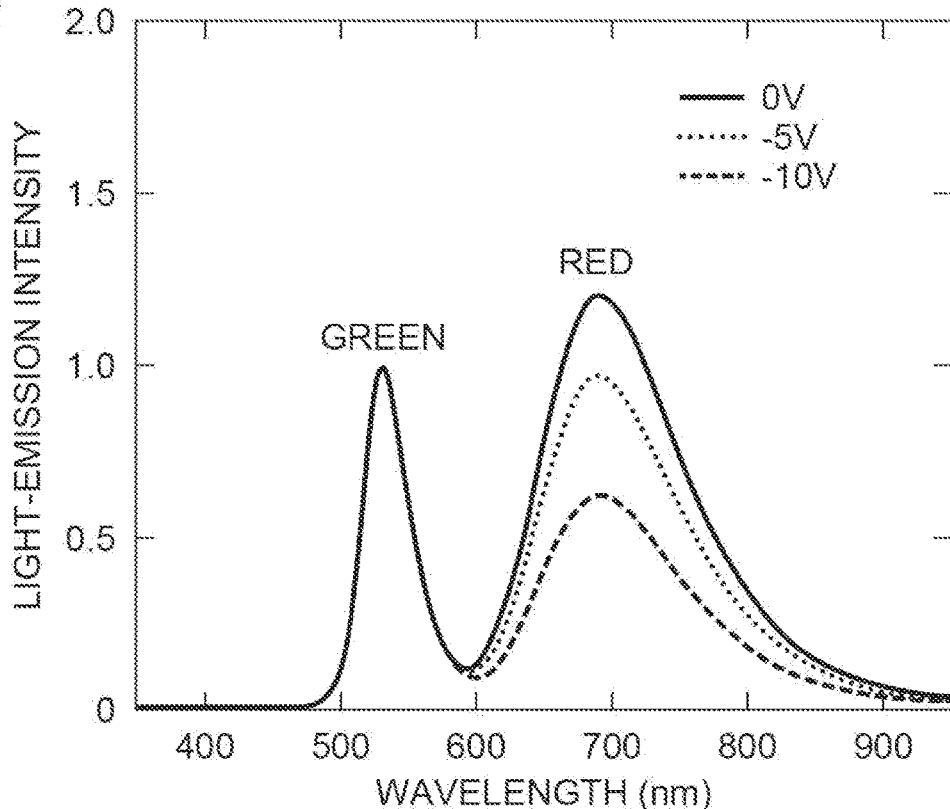

The following results are obtained through verification in the system S2. FIG. 11A is a graph showing a spectrum of the output light L2 detected by the spectrometer 7 in a case where blue input light L1 is emitted from the LED 4. As shown in FIG. 11A, when increasing a value (absolute value) of the voltage that causes an electric field in a direction of causing charge separation to occur in the organic modulation layer 20, a ratio of a red light beam included in the output light L2 decreases. FIG. 11B is a graph showing a spectrum of the output light L2 detected by the spectrometer 7 in a case where green input light L1 is emitted from the LED 4. As shown in FIG. 11B, when increasing a value (absolute value) of the voltage that causes an electric field in a direction of causing charge separation to occur in the organic modulation layer 20, a ratio of a red light beam included in the output light L2 decreases. The results represent that the modulation device 1C according to the third embodiment appropriately functions.

Fourth Embodiment

Figure 12:
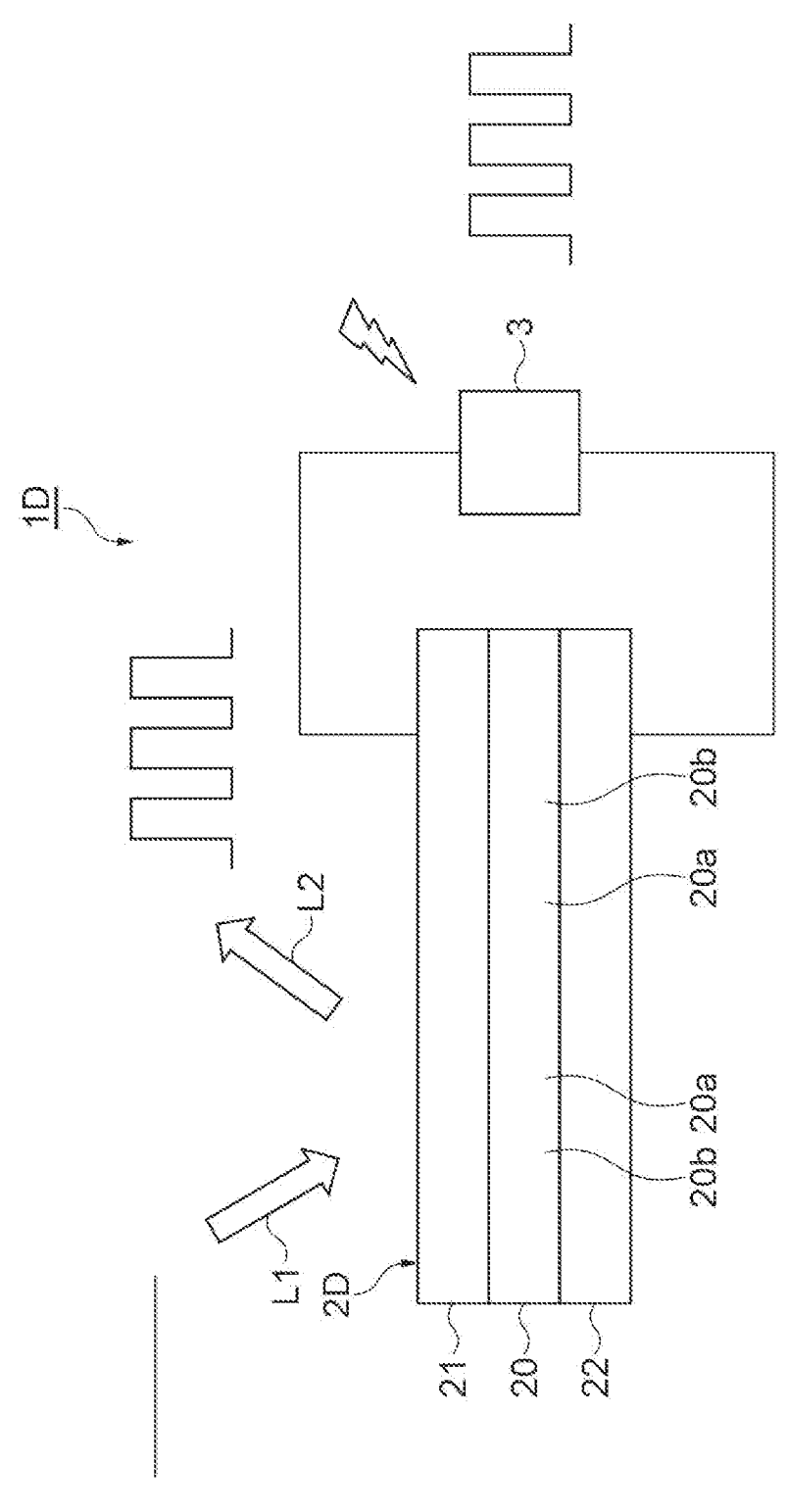
FIG. 12 is a configuration diagram illustrating an operation of a modulation device according to a fourth embodiment.

As illustrated in FIG. 12, a modulation device 1D according to a fourth embodiment is different from the modulation device 1A according to the first embodiment in that the second electrode 22 in an organic modulation element 2D does not have a light-transmitting property with respect to input light L1 and output light L2. In the organic modulation element 2D according to the fourth embodiment, the first electrode 21 has a light-transmitting property with respect to the input light L1 and the output light L2. According to this, modulated output light L2 can be emitted to an incident side of the input light L1.

In the modulation device 1D, the controller 3 applies an arbitrary pulse voltage between the first electrode 21 and the second electrode 22. In a state in which a pulse voltage is applied between the first electrode 21 and the second electrode 22, when the input light L1 that is CW light is incident from the outside to the organic modulation layer 20 through the first electrode 21, the output light L2 that is pulse light having a pulse waveform corresponding to the pulse voltage is emitted from the organic modulation layer 20 to the outside through the first electrode 21.

Figure 13:
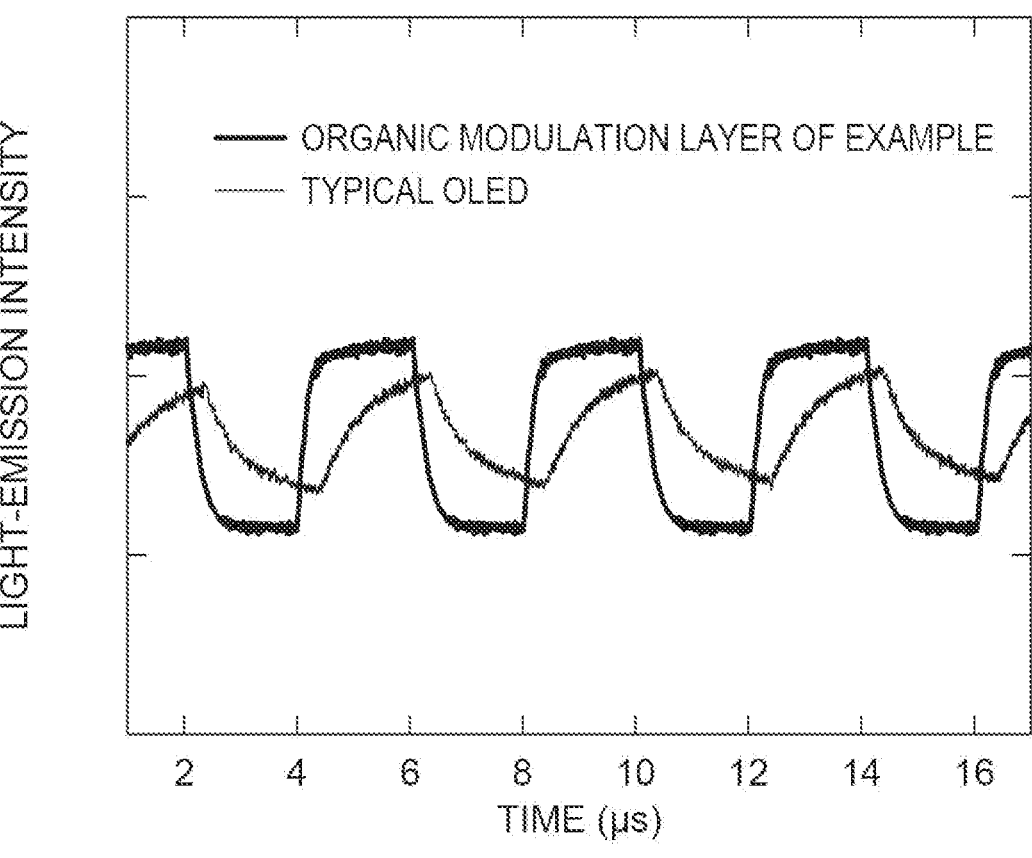
FIG. 13 is a graph showing verification results relating to the function of the modulation device according to the fourth embodiment.

FIG. 13 is a graph showing verification results relating to a function of the modulation device 1D according to the fourth embodiment. As shown in FIG. 13, when a typical OLED is electrically excited (electrically driven), in the case of high-speed modulation, a waveform of output light is distorted. In contrast, in the modulation device 1D (the organic modulation layer 20 according to this embodiment), the organic semiconductor molecules 20a in an excited state are forcibly dissociated into charges and an afterglow component is suppressed, and thus the output light L2 having light-emission intensity in a rectangular wave shape can be obtained. Note that, so as to suppress the afterglow component, it is preferable to dispose a hole transport layer having a HOMO level shallower than a HOMO level of the organic modulation layer 20 between an electrode that functions as a positive electrode between the first electrode 21 and the second electrode 22, and the organic modulation layer 20. In addition, so as to suppress the afterglow component, it is preferable to dispose an electron transport layer having a LUMO level shallower than a LUMO level of the organic modulation layer 20 between an electrode that functions as a negative electrode between the first electrode 21 and the second electrode 22, and the organic modulation layer 20. With regard to arrangement of the hole transport layer and arrangement of the electron transport layer, any one configuration may be embodied or both configurations may be embodied. In addition, any one or both of a molecule capable of being used in the hole transport layer and a molecule capable of being used in the electron transport layer may be contained in the light-emitting layer, and the light-emitting layer may have a structure in which a layer containing the molecule capable of being used in the hole transport layer and a layer containing the molecule capable of being used in the electron transport layer are laminated.

Modification Example

The present disclosure is not limited to the above-described embodiments. In the above-described embodiments, the plurality of organic semiconductor molecules 20a contained in the organic modulation layer 20 may be constituted by a plurality of kinds of organic semiconductor molecules. In the above-described embodiments, the plurality of host molecules 20b contained in the organic modulation layer 20 may be constituted by a plurality of kinds of host molecules. In the above-described embodiments, the organic modulation layer 20 may not contain the plurality of host molecules 20b.

In the above-described embodiments, each of the plurality of organic semiconductor molecules 20a may not satisfy the above-described various conditions as long as a molecule in which an excited state enabling the reverse intersystem crossing from the lowest excited triplet state $T_1$ to the lowest excited singlet state $S_1$ in each of the plurality of organic semiconductor molecules 20a is formed due to irradiation with the input light L1.

In the first embodiment, the first electrode 21 may have a light-transmitting property with respect to the input light L1 and the output light L2, and the second electrode 22 may not have a light-transmitting property with respect to the input light L1 and the output light L2. In the fourth embodiment, the first electrode 21 may have a light-transmitting property with respect to the input light L1, and the second electrode 22 may have a light-transmitting property with respect to the output light L2. In the above-described embodiments, a plurality of the organic modulation layer 20 may be one-directionally arranged or two-directionally arranged.

An organic modulation element according an aspect of the present disclosure includes: an organic modulation layer containing a plurality of organic semiconductor molecules;

a first electrode having a light-transmitting property with respect to input light to the organic modulation layer, and disposed on one side of the organic modulation layer; and a second electrode disposed on the other side of the organic modulation layer. Each of the plurality of organic semiconductor molecules is a molecule in which an excited state enabling reverse intersystem crossing from a lowest excited triplet state to a lowest excited singlet state in each of the plurality of organic semiconductor molecules is formed due to irradiation with the input light. In each of the plurality of organic semiconductor molecules, an intersystem crossing rate constant from the lowest excited singlet state to the lowest excited triplet state is greater than a reverse intersystem crossing rate constant from the lowest excited triplet state to the lowest excited singlet state. In each of the plurality of organic semiconductor molecules, the reverse intersystem crossing rate constant from the lowest excited triplet state to the lowest excited singlet state is greater than a non-radiative deactivation rate constant from the lowest excited triplet state to a ground state.

In the organic modulation element, an excited state enabling reverse intersystem crossing from the lowest excited triplet state to the lowest excited singlet state is formed in each of the plurality of organic semiconductor molecules due to irradiation with the input light transmitted through the first electrode. According to this, in each of the plurality of organic semiconductor molecules, in addition to high-speed charge separation observed until the lowest excited singlet state is mitigated, charge separation from the lowest excited triplet state having a longer lifetime in comparison to the lowest excited singlet state (hereinafter, referred to as "direct charge separation from lowest excited triplet state"), and/or charge separation from the lowest excited singlet state in which the lowest excited triplet state having a longer lifetime in comparison to the lowest excited singlet state is set as a temporary shelter from deactivation (hereinafter, referred to as charge separation from the lowest excited singlet state through the lowest excited triplet state) become possible. Here, in each of the plurality of organic semiconductor molecules, an intersystem crossing rate constant from the lowest excited singlet state to the lowest excited triplet state is greater than a reverse intersystem crossing rate constant from the lowest excited triplet state to the lowest excited singlet state, and thus the lifetime of the lowest excited triplet state is lengthened, and thus sufficient charge separation is likely to be obtained. Accordingly, for example, when a voltage is applied between the first electrode and the second electrode under irradiation with the input light to cause an electric field in a direction of causing charge separation to occur in the organic modulation layer, an excited state in which deactivation (spontaneous emission) is to originally occur according to light-emission is converted into a charge separation state, and thus attenuation is possible. On the other hand, in each of the plurality of organic semiconductor molecules, since the reverse intersystem crossing rate constant from the lowest excited triplet state to the lowest excited singlet state is greater than the non-radiative deactivation rate constant from the lowest excited triplet state to the ground state, deactivation due to heat is less likely to occur, and light-emission is likely to be obtained. Accordingly, for example, when a voltage is not applied between the first electrode and the second electrode, and an electric field in a direction of causing charge separation is not caused to occur in the organic modulation layer, light-emission due to spontaneous emission can be promoted. As described above, according to the organic modulation element, the input light can be modulated in correspondence with a purpose.

In the organic modulation element according to the aspect of the present disclosure, in each of the plurality of organic semiconductor molecules, a difference between energy of the lowest excited singlet state and energy of the lowest excited triplet state at an absolute temperature of 77 K may be less than 0.3 eV. According to this, the individual organic semiconductor molecules can be caused to function as molecules in which an excited state enabling reverse intersystem crossing from the lowest excited triplet state to the lowest excited singlet state is formed due to irradiation with the input light.

In the organic modulation element according to the aspect of the present disclosure, in each of the plurality of organic semiconductor molecules, the intersystem crossing rate constant from the lowest excited singlet state to the lowest excited triplet state may be greater than a fluorescence rate constant from the lowest excited singlet state to the ground state. According to this, direct charge separation from the lowest excited triplet state and/or charge separation from the lowest excited singlet state through the lowest excited triplet state become possible while suppressing deactivation from the lowest excited singlet state due to light-emission.

In the organic modulation element according to the aspect of the present disclosure, in each of the plurality of organic semiconductor molecules, the intersystem crossing rate constant from the lowest excited singlet state to the lowest excited triplet state may be two or more times the reverse intersystem crossing rate constant from the lowest excited triplet state to the lowest excited singlet state. According to this, the lifetime of the lowest excited triple state is lengthened, and thus photoelectric conversion efficiency can be improved.

In the organic modulation element according to the aspect of the present disclosure, in each of the plurality of organic semiconductor molecules, the reverse intersystem crossing rate constant from the lowest excited triplet state to the lowest excited singlet state may be $1 \times 10^7$ (sec$^{-1}$) or less. According to this, the lifetime of the lowest excited triple state is lengthened, and thus photoelectric conversion efficiency can be improved.

In the organic modulation element according to the aspect of the present disclosure, a dipole moment of each of the plurality of organic semiconductor molecules may be greater than 0 D. According to this, energy for charge separation can be reduced.

In the organic modulation element according to the aspect of the present disclosure, the organic modulation layer may further contain a plurality of host molecules, and energy of the lowest excited triplet state at an absolute temperature of 77 K in each of the plurality of host molecules may be higher than energy of a lowest excited triplet state at an absolute temperature of 77 K in each of the plurality of organic semiconductor molecules. According to this, it is possible to suppress a decrease in photoelectric conversion efficiency due to an influence of the plurality of host molecules.

In the organic modulation element according to the aspect of the present disclosure, the second electrode may have a light-transmitting property with respect to output light from the organic modulation layer. According to this, modulated output light can be emitted to a side opposite to an incident side of the input light.

In the organic modulation element according to the aspect of the present disclosure, the first electrode may have a light-transmitting property with respect to output light from the organic modulation layer. According to this, modulated output light can be emitted to the incident side of the input light.

An organic modulation element according to another aspect of the present disclosure includes: an organic modulation layer containing a plurality of organic semiconductor molecules; a first electrode having a light-transmitting property with respect to input light to the organic modulation layer, and disposed on one side of the organic modulation layer; a second electrode having a light-transmitting property with respect to output light from the organic modulation layer, and disposed on the other side of the organic modulation layer; a light-receiving layer disposed on the other side of the second electrode and configured to receive the output light. Each of the plurality of organic semiconductor molecules is a molecule in which an excited state enabling reverse intersystem crossing from a lowest excited triplet state to a lowest excited singlet state in each of the plurality of organic semiconductor molecules is formed due to irradiation with the input light.

According to the individual organic modulation element, input light is modulated in correspondence with a purpose, and output light modulated in correspondence with the purpose can be detected.

An organic modulation element according to still another aspect of the present disclosure includes: an organic modulation layer containing a plurality of organic semiconductor molecules; a first electrode having a light-transmitting property with respect to input light to the organic modulation layer, and disposed on one side of the organic modulation layer; a second electrode having a light-transmitting property with respect to output light from the organic modulation layer, and disposed on the other side of the organic modulation layer; and a light-emitting layer disposed on the one side of the first electrode, and configured to emit the input light. Each of the plurality of organic semiconductor molecules is a molecule in which an excited state enabling reverse intersystem crossing from a lowest excited triplet state to a lowest excited singlet state in each of the plurality of organic semiconductor molecules is formed due to irradiation with the input light.

According to the organic modulation element, input light is modulated in correspondence with a purpose, and output light modulated in correspondence with the purpose can be emitted.

A modulation device according to still another aspect of the present disclosure includes: an organic modulation layer containing a plurality of organic semiconductor molecules; a first electrode having a light-transmitting property with respect to input light to the organic modulation layer, and disposed on one side of the organic modulation layer; a second electrode disposed on the other side of the organic modulation layer; and a controller configured to modulate a voltage to be applied between the first electrode and the second electrode. Each of the plurality of organic semiconductor molecules is a molecule in which an excited state enabling reverse intersystem crossing from a lowest excited triplet state to a lowest excited singlet state in each of the plurality of organic semiconductor molecules is formed due to irradiation with the input light.

According to the modulation device, input light can be modulated in correspondence with a purpose.

According to the present disclosure, it is possible to provide an organic modulation element capable of modulating input light in correspondence with a purpose, and a modulation device including the organic modulation element.

What is claimed is:

1. A modulation device comprising:
an organic modulation layer containing a plurality of organic semiconductor molecules;
a first electrode having a light-transmitting property with respect to input light to the organic modulation layer, and disposed on one side of the organic modulation layer;
a second electrode disposed on the other side of the organic modulation layer; and
a controller configured to modulate a voltage to be applied between the first electrode and the second electrode,
wherein each of the plurality of organic semiconductor molecules is a molecule in which an excited state enabling reverse intersystem crossing from a lowest excited triplet state to a lowest excited singlet state in each of the plurality of organic semiconductor molecules is formed due to irradiation with the input light, and
the controller comprising circuitry configured to apply a voltage between the first electrode and the second electrode so that an electric field in a direction of causing charge separation occurs in the organic modulation layer, and thereby reduces light emission due to spontaneous emission from the organic modulation layer under irradiation with the input light.

2. The modulation device according to claim 1,
wherein in each of the plurality of organic semiconductor molecules, a difference between energy of the lowest excited singlet state and energy of the lowest excited triplet state at an absolute temperature of 77 K is less than 0.3 eV.

3. The modulation device according to claim 1,
wherein in each of the plurality of organic semiconductor molecules, the intersystem crossing rate constant from the lowest excited singlet state to the lowest excited triplet state is greater than a fluorescence rate constant from the lowest excited singlet state to the ground state.

4. The modulation device according to claim 1,
wherein in each of the plurality of organic semiconductor molecules, the intersystem crossing rate constant from the lowest excited singlet state to the lowest excited triplet state is two or more times the reverse intersystem crossing rate constant from the lowest excited triplet state to the lowest excited singlet state.

5. The modulation device according to claim 4,
wherein in each of the plurality of organic semiconductor molecules, the reverse intersystem crossing rate constant from the lowest excited triplet state to the lowest excited singlet state is $1 \times 10^7$ (sec$^{-1}$) or less.

6. The modulation device according to claim 1,
wherein a dipole moment of each of the plurality of organic semiconductor molecules is greater than 0 D.

7. The modulation device according to claim 1,
wherein the organic modulation layer further contains a plurality of host molecules, and
energy of the lowest excited triplet state at an absolute temperature of 77 K in each of the plurality of host molecules is higher than energy of a lowest excited triplet state at an absolute temperature of 77 K in each of the plurality of organic semiconductor molecules.

8. The modulation device according to claim 1,
wherein the second electrode has a light-transmitting property with respect to output light from the organic modulation layer.

9. The modulation device according to claim 1, wherein the first electrode has a light-transmitting property with respect to output light from the organic modulation layer.

10. The modulation device according to claim 1, wherein the second electrode has a light-transmitting property with respect to output light from the organic modulation layer, and a light-receiving layer is disposed on the other side of the second electrode, and configured to receive the output light.

11. The modulation device according to claim 1, wherein the second electrode has a light-transmitting property with respect to output light from the organic modulation layer, and a light-emitting layer is disposed on the one side of the first electrode, and configured to emit the input light.

12. The modulation device according to claim 1, wherein in each of the plurality of organic semiconductor molecules, an intersystem crossing rate constant from the lowest excited singlet state to the lowest excited triplet state is greater than a reverse intersystem crossing rate constant from the lowest excited triplet state to the lowest excited singlet state, and in each of the plurality of organic semiconductor molecules, the reverse intersystem crossing rate constant from the lowest excited triplet state to the lowest excited singlet state is greater than a non-radiative deactivation rate constant from the lowest excited triplet state to a ground state.

13. A modulation method comprising:

preparing an organic modulation element comprising an organic modulation layer containing a plurality of organic semiconductor molecules, a first electrode having a light transmitting property with respect to input light to the organic modulation layer and disposed on one side of the organic modulation layer, and a second electrode disposed on the other side of the organic modulation layer, wherein each of the plurality of organic semiconductor molecules is a molecule in which an excited state enabling reverse intersystem crossing from a lowest excited triplet state to a lowest excited singlet state in each of the plurality of organic semiconductor molecules is formed due to irradiation with the input light; and modulating a voltage to be applied between the first electrode and the second electrode, wherein, in modulating the voltage, a voltage is applied between the first electrode and the second electrode so that an electric field in a direction of causing charge separation occurs in the organic modulation layer, and thereby light emission due to spontaneous emission from the organic modulation layer under irradiation with the input light is reduced.

* * * * *